United States Patent
Lee et al.

(10) Patent No.: US 8,211,804 B2
(45) Date of Patent: Jul. 3, 2012

(54) METHODS OF FORMING A HOLE HAVING A VERTICAL PROFILE AND SEMICONDUCTOR DEVICES HAVING A VERTICAL HOLE

(75) Inventors: Hyo-San Lee, Suwon-si (KR); Bo-Un Yoon, Seoul (KR); Kun-Tack Lee, Suwon-si (KR); Dae-Hyuk Kang, Hwaseong-si (KR); Seong-Ho Moon, Yongin-si (KR); So-Ra Han, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/025,410

(22) Filed: Feb. 11, 2011

(65) Prior Publication Data

US 2011/0201203 A1 Aug. 18, 2011

(30) Foreign Application Priority Data

Feb. 12, 2010 (KR) ........................ 10-2010-0013113

(51) Int. Cl.
*H01L 21/311* (2006.01)

(52) U.S. Cl. ........ 438/700; 438/693; 438/694; 438/695; 438/701; 438/702; 438/703; 438/704; 438/705; 438/706; 438/707; 438/708; 438/709; 257/E21.252; 257/E21.253; 257/E21.254

(58) Field of Classification Search .................... None
See application file for complete search history.

(56) References Cited

U.S. PATENT DOCUMENTS

2009/0061635 A1* 3/2009 Wu et al. .................. 438/701
2009/0081876 A1 3/2009 Bera et al.

FOREIGN PATENT DOCUMENTS

KR 1020060077253 7/2006
KR 1020090091523 8/2009

* cited by examiner

*Primary Examiner* — Charles Garber
*Assistant Examiner* — Yasser Abdelaziez
(74) *Attorney, Agent, or Firm* — Onello & Mello, LLP

(57) ABSTRACT

In a method of forming a hole, an insulation layer is formed on a substrate, and a preliminary hole exposing the substrate is formed through the insulation layer. A photosensitive layer pattern including an organic polymer is then formed on the substrate to fill the preliminary hole. An etching gas including hydrogen fluoride (HF) or fluorine ($F_2$) is then provided onto the photosensitive layer pattern to etch the insulation layer so that width of the preliminary hole is increased.

20 Claims, 21 Drawing Sheets

METHODS OF FORMING A HOLE HAVING A VERTICAL PROFILE AND SEMICONDUCTOR DEVICES HAVING A VERTICAL HOLE

CLAIM OF PRIORITY

This application claims priority under 35 USC §119 to Korean Patent Application No. 10-2010-0013113, filed on Feb. 12, 2010, in the Korean Intellectual Property Office (KIPO), the contents of which are herein incorporated by reference in their entirety.

BACKGROUND

1. Field

Example embodiments relate to methods of forming a hole, more particularly, methods of forming a hole having a vertical profile.

2. Description of the Related Art

As semiconductor devices have been highly integrated, a trench or a hole having a high aspect ratio is typically formed. When a trench or a hole having a high aspect ratio is formed, however, the width of the trench or the hole may become smaller as the depth thereof becomes deeper, though forming a trench or a hole having a width that does not vary according to the depth thereof may be advantageous.

SUMMARY

Example embodiments provide a method of forming a trench or a hole having a substantially vertical profile.

According to example embodiments of a method of forming a hole, an insulation layer is formed on a substrate; and the substrate is exposed by forming a preliminary hole through the insulation layer. Next, a photosensitive layer pattern including an organic polymer is formed on the substrate to fill the preliminary hole. An etching gas including hydrogen fluoride (HF) or fluorine ($F_2$) is provided onto the photosensitive layer pattern to etch the insulation layer so that the width of the preliminary hole is increased.

In example embodiments, the insulation layer may include silicon oxide.

In example embodiments, the organic polymer may include a hydroxyl group (—OH), an amino group (—$NH_2$) or a thiol group (—SH).

In example embodiments, the etching gas may include deionized water (DIW) vapor.

In example embodiments, when the etching gas is provided onto the photosensitive layer pattern to etch the insulation layer, a portion of the insulation layer adjacent to a lower (proximate) portion of the photosensitive layer pattern that is proximate the substrate may be etched.

In example embodiments, when the etching gas is provided onto the photosensitive layer pattern to etch the insulation layer, water may be formed by reacting the etching gas with the photosensitive layer pattern.

In example embodiments, water generated by the reaction of the etching gas and an upper (remote) portion of the photosensitive layer pattern that is remote from the substrate may be vaporized, and water generated by the reaction of the etching gas and a lower (proximate) portion of the photosensitive layer pattern that is proximate the substrate may not be vaporized. As these terms are used herein, the photosensitive layer (and analogous structures) can be conceptually split into a proximate portion and a remote portion with the substrate as a comparative reference, wherein the proximate portion is nearer the substrate than is the remote portion; and, in the orientation of the Figures, the proximate portion is lower than the remote portion.

In example embodiments, the etching gas may be provided onto the photosensitive layer pattern at a temperature of about 120 to about 180° C.

In example embodiments, the photosensitive layer pattern may fill a lower (proximate) portion of the preliminary hole.

In example embodiments, before forming the insulation layer, an etch stop layer is added to the substrate to form a surface thereof, and the preliminary hole may expose the etch stop layer.

According to example embodiments of a method of forming a trench, an insulation layer is formed on a substrate. An upper (remote) portion of the insulation layer is removed to form a preliminary trench in the insulation layer, and a photosensitive layer pattern that fills the preliminary trench and including an organic polymer is formed. An etching gas including hydrogen fluoride (HF) or fluorine ($F_2$) is then provided onto the photosensitive layer pattern to etch the insulation layer so that a width of the preliminary trench is increased.

In example embodiments, the insulation layer may include silicon oxide.

In example embodiments, the organic polymer may include a hydroxyl group (—OH), an amino group (—$NH_2$) or a thiol group (—SH).

In example embodiments, the etching gas may include deionized water (DIW) vapor.

In example embodiments, when the etching gas is provided onto the photosensitive layer pattern to etch the insulation layer, a portion of the insulation layer adjacent to a lower (proximate) portion of the photosensitive layer pattern may be etched.

In example embodiments, when the etching gas is provided onto the photosensitive layer pattern, water may be formed by reacting the etching gas with the photosensitive layer pattern.

In example embodiments, water generated by the reaction of the etching gas and an upper (remote) portion of the photosensitive layer pattern may be vaporized, and water generated by the reaction of the etching gas and a lower (proximate) portion of the photosensitive layer pattern may not be vaporized.

According to example embodiments of a method of forming a hole, an insulation layer is formed on a substrate; and the substrate is exposed by forming a preliminary hole through the insulation layer. A porous layer pattern including an organic polymer is then formed on the substrate to fill the preliminary hole. An etching gas including hydrogen fluoride (HF) or fluorine ($F_2$) is then provided onto the porous layer pattern to etch the insulation layer so that a width of the preliminary hole is increased.

In example embodiments, the insulation layer may include silicon oxide, and the porous layer pattern may include silicon-on-glass (SOG).

In example embodiments, when the etching gas is provided onto the porous layer pattern to etch the insulation layer, a portion of the insulation layer adjacent to a lower (proximate) portion of the porous layer pattern may be etched.

According to example embodiments, a photosensitive layer pattern may be formed in a preliminary hole through an insulation layer including silicon oxide, and an etching gas including hydrogen fluoride may be provided onto the photosensitive layer pattern to etch a portion of the insulation layer adjacent to a lower (proximate) portion of the photosensitive layer pattern. Thus, a width of a lower (proximate)

portion of the preliminary hole having a high aspect ratio may be increased so that a hole having a vertical profile may be formed.

BRIEF DESCRIPTION OF THE DRAWINGS

Example embodiments will be more clearly understood from the following detailed description taken in conjunction with the accompanying drawings.

FIGS. 1 to 2 are cross-sectional views illustrating a method of forming a trench or a hole in accordance with example embodiments;

FIGS. 3 to 4 are cross-sectional views illustrating a method of forming a trench or a hole in accordance with other example embodiments;

FIGS. 5 to 16 are cross-sectional views illustrating a method of manufacturing a semiconductor device using the method of forming the trench or the hole in accordance with example embodiments; and FIGS. 17 to 30 are cross-sectional views illustrating a method of manufacturing a semiconductor device using the method of forming the trench or the hole in accordance with example embodiments.

DETAILED DESCRIPTION OF THE EMBODIMENTS

Figure 1:
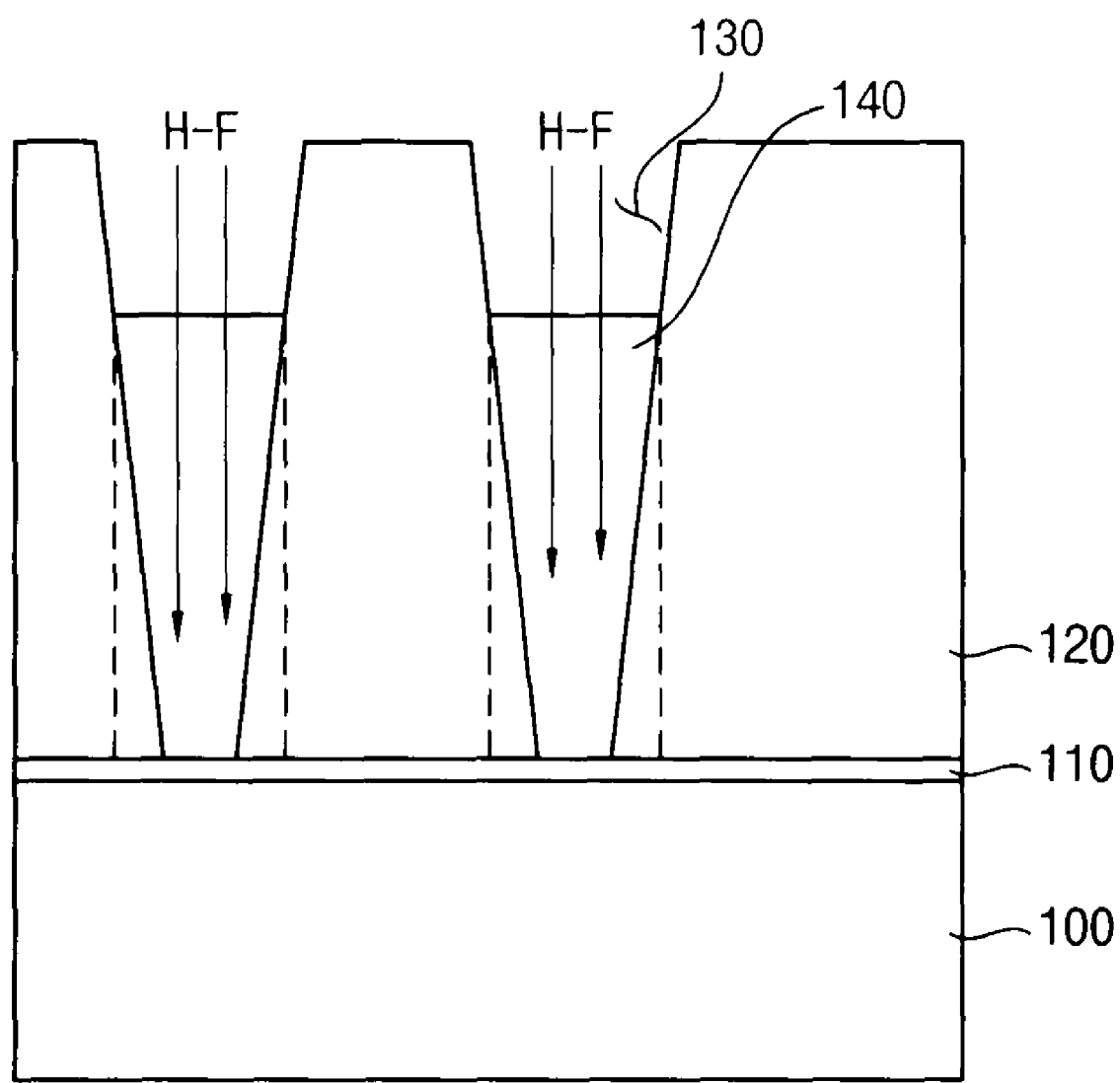
FIGS. 1 to 30 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as being limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms, first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms, "a," "an" and "the," are intended to include the plural forms as well, unless the context clearly indicates otherwise. It will be further understood that the terms, "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
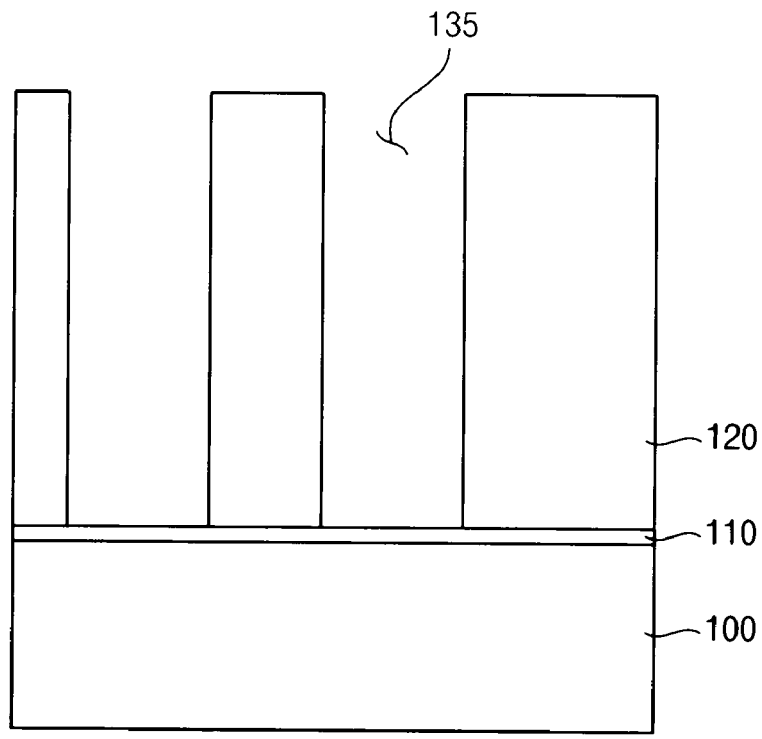

FIGS. 1 to 2 are cross-sectional views illustrating a method of forming a trench or a hole in accordance with example embodiments.

Referring to FIG. 1, an etch stop layer 110 may be added to a substrate 100 to form a surface thereof. The etch stop layer 110 may be formed of a nitride. The etch stop layer 110 may be formed by a chemical vapor deposition (CVD) process or an atomic layer deposition (ALD) process. In an example embodiment, the etch stop layer may be formed to have a thickness of about 200 Å.

An insulation layer 120 may be formed on the etch stop layer 110. The insulation layer 120 may serve as a mold layer for forming elements, such as a capacitor, or as an insulating interlayer. In example embodiments, the insulation layer 120 may be formed of silicon oxide and have a thickness of about 10,000 to about 20,000 Å.

The insulation layer 120 may be partially removed by a photolithography process to form a preliminary hole 130 therethrough, which may expose the etch stop layer 110. The preliminary hole 130 may have a high aspect ratio because the insulation layer 120 may have a large thickness, and thus the preliminary hole 130 may not be formed to have a vertical profile with respect to the substrate 100. That is, the width of the preliminary hole 130 may become smaller as the depth thereof becomes deeper, and thus a sidewall of the preliminary hole 130 may be slanted.

A photosensitive layer pattern 140 may be formed on the etch stop layer 110 to partially fill the preliminary hole 130.

In example embodiments, a photosensitive layer may be formed on the etch stop layer 110 and the insulation layer 120 to sufficiently fill the preliminary hole 130, and an upper (remote) portion of the photosensitive layer may be removed to form the photosensitive layer pattern 140 partially filling the preliminary hole 130. The photosensitive layer 140 may be formed of an organic polymer having a hydroxyl group (—OH), an amino group (—NH$_2$) or a thiol group (—SH). In an example embodiment, the organic polymer may have a molecular weight of about 5,000 to about 100,000.

An etching gas may be provided onto the photosensitive layer pattern 140.

In example embodiments, the etching gas may include hydrogen fluoride (HF) or fluorine (F$_2$). The etching gas may further include deionized water (DIW) vapor. A chamber (not shown) into which the substrate 100 and the etching gas are provided may have a high internal temperature of about 120 to about 180° C. The etching gas, including hydrogen fluoride (HF) or fluorine (F$_2$), may diffuse into the photosensitive layer pattern 140 and react with some elements of the photosensitive layer pattern 140, such as a hydroxyl group (—OH) to form water as a by-product. Thus, the hydrogen fluoride (HF) or fluorine (F$_2$) in the etching gas may be dissolved in the water, and a portion of the insulation layer 120 adjacent to the photosensitive layer pattern 140 may be wet etched.

In the etching process, the internal temperature of the chamber is so high that water generated at an upper (remote) portion of the photosensitive layer pattern 140 may be vaporized; however, water generated at a lower (proximate) portion of the photosensitive layer pattern 140 may not be vaporized because of blocking of the upper (remote) portion of the photosensitive layer pattern 140. Thus, a portion of the insulation layer 120 adjacent to the lower (proximate) portion of the photosensitive layer pattern 140 may be etched better than that of the insulation layer pattern 120 adjacent to the upper (remote) portion of the photosensitive layer pattern 140.

In an example embodiment, the etching gas may be provided into the chamber at a flow rate above about 500 standard cubic centimeters per minute (sccm) under a pressure of about 1 to about 30 Torr.

In an example embodiment, before providing the etching gas into the chamber, a preliminary process using oxygen (O$_2$) plasma, hydrogen peroxide (H$_2$O$_2$), or ozone (O$_3$) may be performed on the substrate 100.

Referring to FIG. 2, the photosensitive layer pattern 140 in the preliminary hole 130 may be removed, so that a hole 135 having a vertical profile may be formed.

The photosensitive layer pattern 140 may be removed by a cleaning process using DIW or tetra methyl ammonium hydroxide (TMAH). When TMAH is used in the cleaning process, a cleaning solution having about 1.0 to about 10 percent by weight of TMAH may be used. In an example embodiment, the cleaning process may be performed at a temperature of about 25 to about 75° C.

Until now, the method of forming the hole 135 (or the preliminary hole 130) through the insulation layer 120 has been illustrated, however, the scope of the present inventive concept may cover a method of forming a trench or a recess in the insulation layer 120. In this case, the etch stop layer 110 may be added to the substrate 100.

Figure 3:
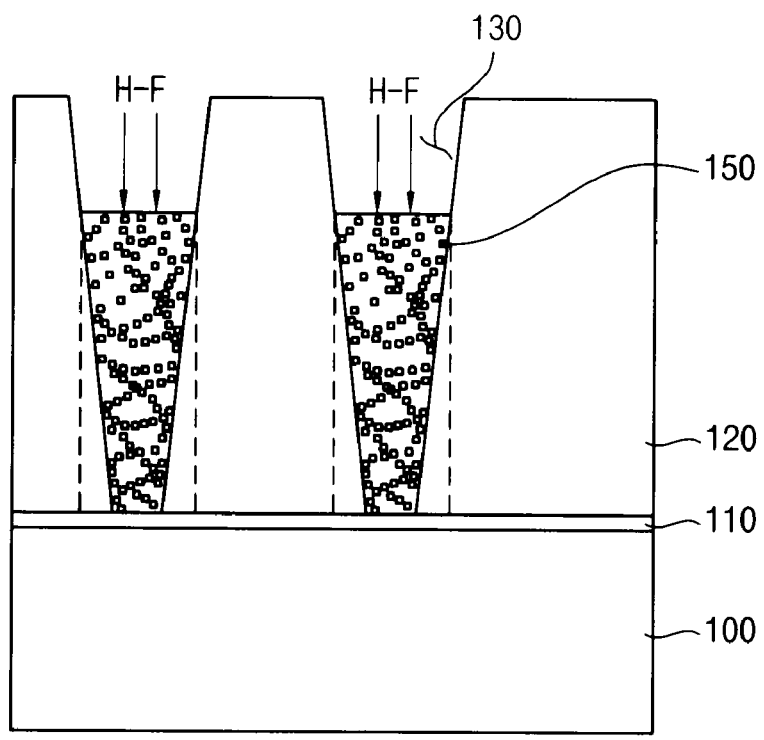
Figure 4:
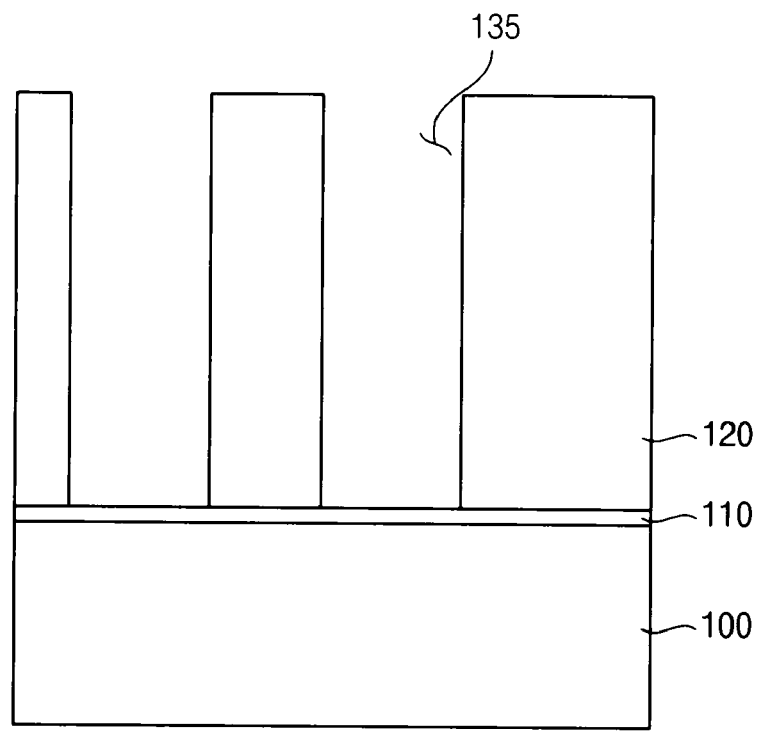

FIGS. 3 to 4 are cross-sectional views illustrating a method of forming a trench or a hole in accordance with other example embodiments. The method of forming the trench or the hole may be substantially the same as that illustrated with reference to FIGS. 1 and 2 except for the photosensitive layer pattern 140. Thus, like reference numerals refer to like elements, and detailed explanations thereon are omitted herein.

Referring to FIG. 3, an etch stop layer 110 may be added to a substrate 100, and an insulation layer 120 may be formed on the etch stop layer 110. The insulation layer 120 may be partially removed by a photolithography process to form a preliminary hole 130 therethrough, which may expose the etch stop layer 110.

A porous layer pattern 150 may be formed on the etch stop layer 110 to partially fill the preliminary hole 130.

In example embodiments, a porous layer may be formed on the etch stop layer 110 and the insulation layer 120 to sufficiently fill the preliminary hole 130, and an upper (remote) portion of the porous layer may be removed to form the porous layer pattern 150 partially filling the preliminary hole 130. The porous layer 150 may be formed of a material through which an etching gas or vapor may penetrate. In an example embodiment, the porous layer 150 may be formed of spin on glass (SOG).

An etching gas may be provided onto the porous layer pattern 150.

In example embodiments, the etching gas may include hydrogen fluoride (HF) or fluorine (F$_2$). The etching gas may further include deionized water (DIW) vapor. A chamber (not shown) into which the substrate 100 and the etching gas are provided may have a high internal temperature of about 120 to about 180° C. The etching gas, including hydrogen fluoride (HF) or fluorine (F$_2$), may diffuse into the porous layer pattern 150 and react with some elements of the porous layer pattern 150, such as the hydroxyl group (—OH), to form water as a by-product. Thus, the hydrogen fluoride (HF) or fluorine (F$_2$) in the etching gas may be melted in the water and a portion of the insulation layer 120 adjacent to the porous layer pattern 150 may be wet etched.

In the etching process, the internal temperature of the chamber is so high that water generated at an upper portion of the porous layer pattern 150 may be vaporized, however, water generated at a lower (proximate) portion of the porous layer pattern 150 may not be vaporized because of blocking of the upper (remote) portion of the porous layer pattern 150. Thus, a portion of the insulation layer 120 adjacent to the lower (proximate) portion of the porous layer pattern 150 may be etched better than that of the insulation layer pattern 120 adjacent to the upper (remote) portion of the porous layer pattern 150.

Referring to FIG. 4, the porous layer pattern 150 in the preliminary hole 130 may be removed so that a hole 135 having a vertical profile may be formed.

FIGS. 5 to 16 are cross-sectional views illustrating a method of manufacturing a semiconductor device using the method of forming the trench or the hole in accordance with example embodiments.

Figure 5:
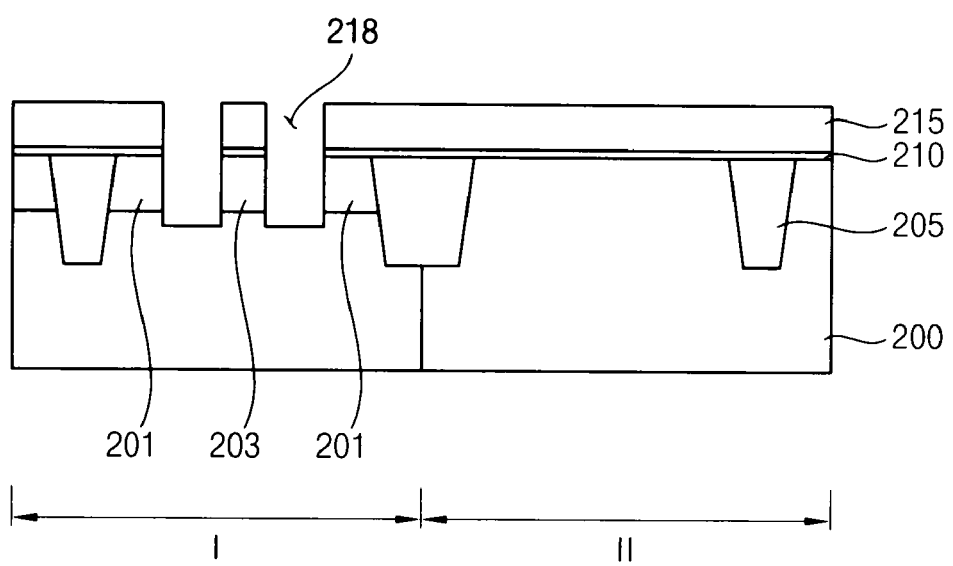

Referring to FIG. 5, impurities may be implanted into upper portions of a substrate 200 in a first region I to form a first impurity region 201 and a second impurity region 203. An isolation layer 205 may be formed on the substrate 100 to define an active region and a field region.

The substrate 200 may include a semiconductor substrate, such as a silicon substrate, a germanium substrate or a silicon-germanium substrate, a silicon-on-insulator (SOI) substrate, a germanium-on-insulator (GOI) substrate, and the like. The substrate 200 may be divided into the first region I in which memory cells are formed and a second region II in which peripheral circuits are formed.

The isolation layer 205 may be formed by a shallow trench isolation (STI) process in which a trench (not shown) may be formed at an upper portion of the substrate 200. Before forming the isolation layer 205, a thermal oxidation layer (not shown) may be formed on an inner wall of the trench and a nitride liner (not shown) may be further formed on the thermal oxidation layer.

The impurities may include, for example, n-type impurities such as boron or arsenic. The first and second impurity regions 201 and 203 may serve as a source/drain region of the memory cells.

A pad oxide layer 210 may be formed on the substrate 200 and the isolation layer 205. The pad oxide layer 210 may be formed by a thermal oxidation process and may have a thickness of about 50 to about 150 Å.

A hard mask layer may be formed on the pad oxide layer 210. The hard mask layer may be formed of a material, such as silicon nitride, having an etching selectivity with respect to the pad oxide layer 210.

In an example embodiment, the hard mask layer may be formed to have a multi-layered structure having a lower layer (not shown), a middle layer (not shown) and an upper layer (not shown). The lower layer may be an oxide formed by a plasma oxidation process to have a thickness of about 2,000 to about 3,000 Å; the middle layer may be formed of amorphous carbon and have a thickness of about 2,000 to about 3,000 Å; and the upper layer may be formed of a nitride and have a thickness of about 500 Å.

The hard mask layer may be patterned to form a hard mask 215, and the pad oxide layer 210 and the substrate 200 may be partially removed using the hard mask 215 as an etching mask to form a recess 218. In an example embodiment, the recess 218 may have a bottom lower than that of the first and second impurity regions 201 and 203.

Figure 6:
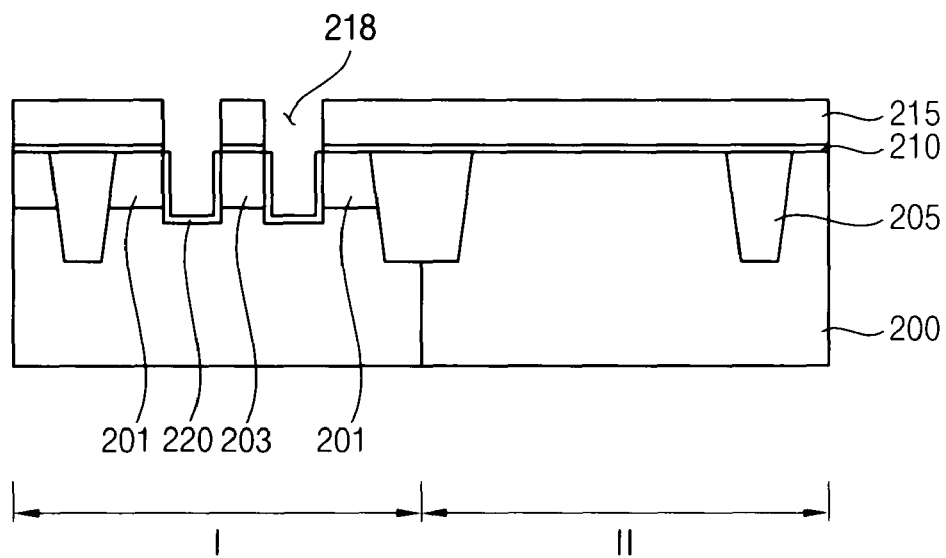

Referring to FIG. 6, after cleaning the substrate 200, a first gate insulation layer 220 may be formed on an inner wall of the recess 218.

The gate insulation layer 220 may be formed of a metal oxide having a high dielectric constant, such as hafnium oxide, zirconium oxide, tantalum oxide, titanium oxide, and the like.

Figure 7:
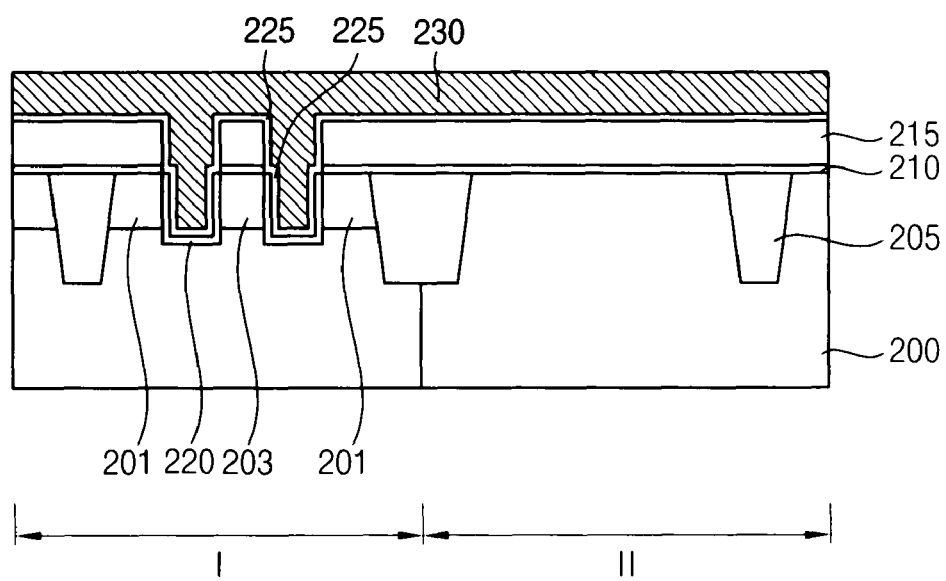

Referring to FIG. 7, a barrier layer 225 may be formed on the first gate insulation layer 220, the pad oxide layer 210 and the hard mask 215. A first gate electrode layer 230 may be formed on the barrier layer 225 to fill a remaining portion of the recess 218.

The first gate electrode layer 230 may be formed of a metal, a metal nitride and/or a metal silicide. For example, the first gate electrode layer 230 may be formed of titanium, tungsten, tantalum, titanium nitride, tungsten nitride, tantalum nitride, titanium silicon nitride, tungsten silicon nitride, etc.

Figure 8:
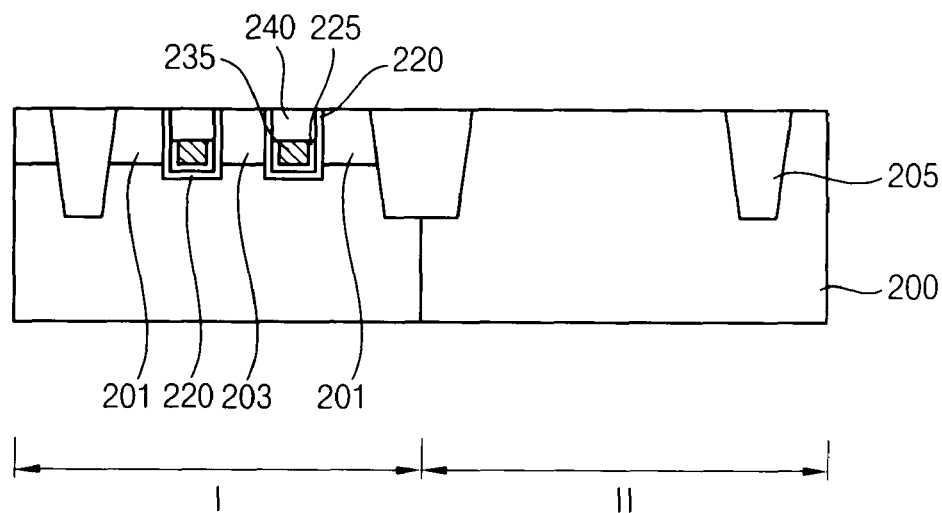

The first gate electrode layer 230, shown in FIG. 7, may be planarized, e.g., by a chemical mechanical polishing (CMP) process, until a top surface of the substrate 200 is exposed, as shown in FIG. 8. In the planarization process, a portion of the barrier layer 225, the hard mask 215 and the pad oxide layer 210 may be also removed.

An upper portion of the first gate electrode layer 230 may be removed until an upper portion of the recess 218 is exposed to form a first gate electrode 235. In the removal of the upper portion of the first gate electrode layer 230, a portion of the barrier layer 225 may be also removed, so that the barrier layer 225 may have a top surface coplanar with that of the first gate electrode layer 235.

A gate mask 240 may be formed on the first gate electrode 235 to fill a remaining portion of the recess 218. The gate mask 240 may be formed of a nitride or an oxide.

Figure 9:
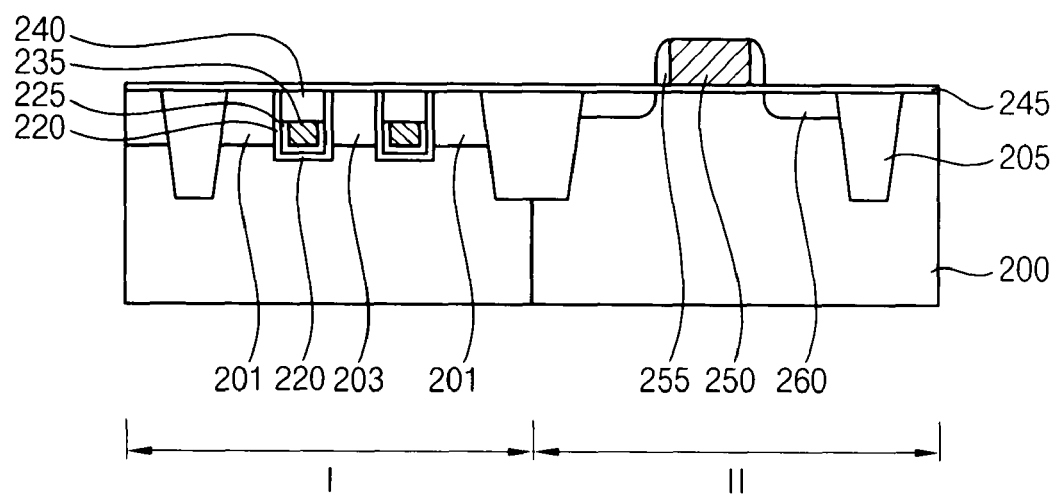

Referring to FIG. 9, a second gate insulation layer 245 may be formed on the substrate 200 and the isolation layer 205. The second gate insulation layer 245 may be formed of silicon oxide or a metal oxide, such as hafnium oxide, zirconium oxide, tantalum oxide, etc.

A conductive layer 250 may be formed on the second gate insulation layer 245 and patterned to form a bit line (not shown) in the first region I and a second gate electrode 250 in the second region II.

Before forming the conductive layer, a blocking layer (not shown) may be further formed on the second gate insulation layer 245 in the first region I, and a first plug (not shown) may be formed through the blocking layer to be electrically connected to the second impurity region 203. In this case, the bit line may be formed to be electrically connected to the first plug.

The conductive layer 250 may be formed of a metal, a metal nitride and/or a metal silicide. For example, the conductive layer 250 may be formed of titanium, tungsten, tantalum, titanium nitride, tungsten nitride, tantalum nitride, titanium silicon nitride, tungsten silicon nitride, etc.

A spacer 255 may be formed on a sidewall of the second gate electrode 250. Impurities may be implanted into the substrate 200 in the second region II using the second gate electrode 250 and the spacer 255 as an etching mask to form a third impurity region 260 at an upper portion of the substrate 200 adjacent to the second gate electrode 250. The third impurity region 260 may serve as a source/drain region of a transistor including the second gate electrode 250.

Figure 10:
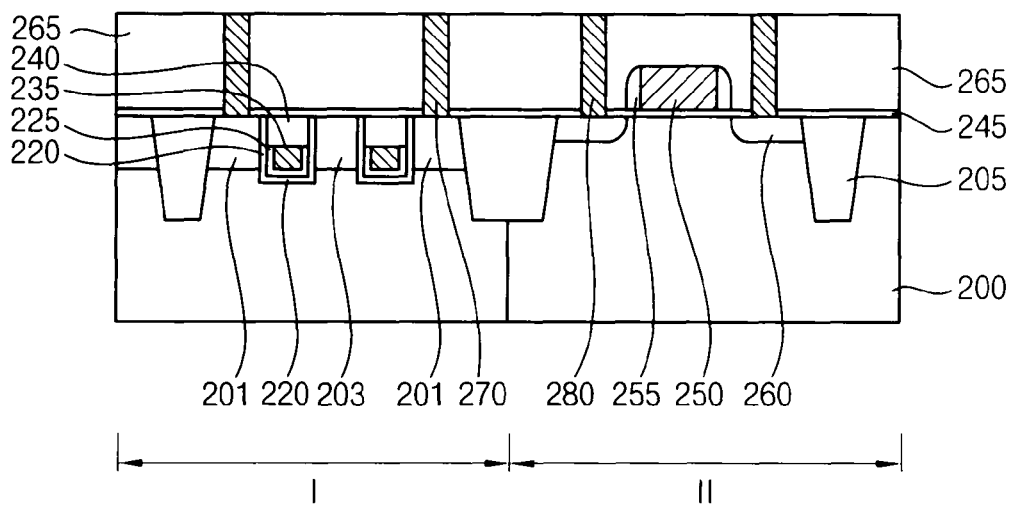

Referring to FIG. 10, a first insulating interlayer 265 may be formed on the substrate 200 to cover the bit line, the second gate electrode 250 and the spacer 255. The first insulating interlayer 265 may comprise an oxide formed by a CVD process. In an example embodiment, the first insulating interlayer 265 may be formed to a thickness of about 3,000 to about 5,000 Å.

Second and third plugs 270 and 280 may be formed through the first insulating interlayer 265 and the second gate insulation layer 245 to be electrically connected to the first and third impurity regions 201 and 260, respectively.

The second and third plugs 270 and 280 may be formed of a metal, a metal nitride and/or a metal silicide. For example, the second and third plugs 270 and 280 may be formed of titanium, tungsten, tantalum, titanium nitride, tungsten nitride, tantalum nitride, titanium silicon nitride, tungsten silicon nitride, etc.

Figure 11:
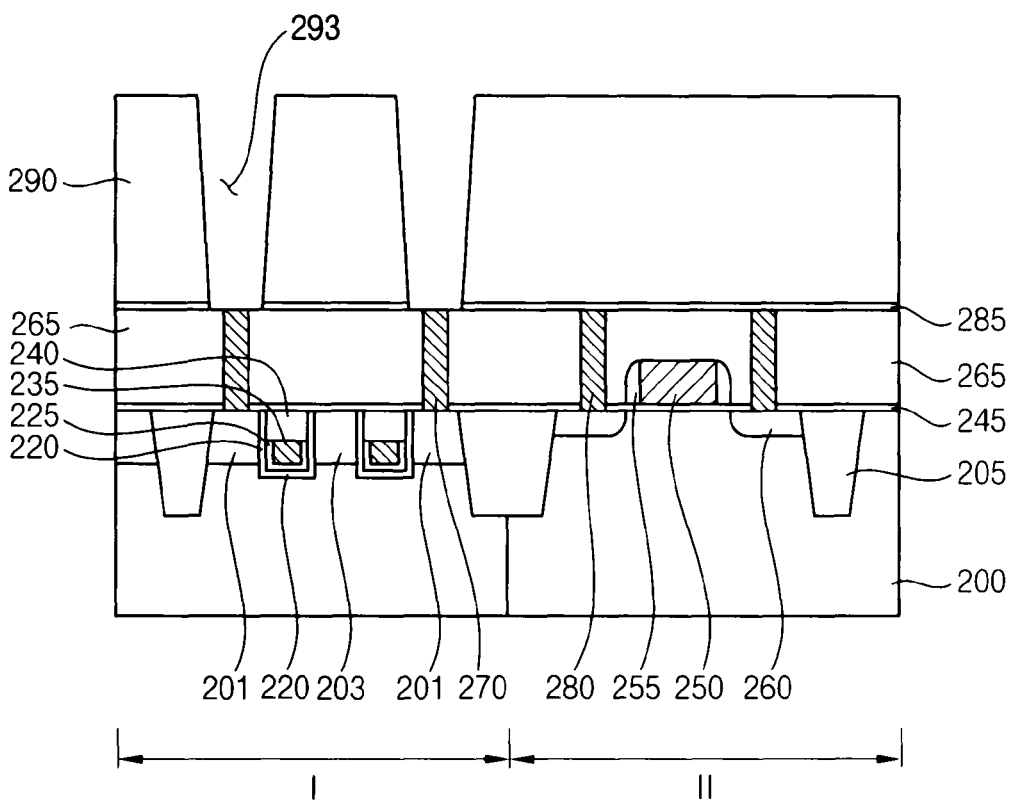

Referring to FIG. 11, an etch stop layer 285 and a mold layer 290 may be sequentially formed on the first insulating interlayer 265 and the second and third plugs 270 and 280. The etch stop layer 285 may comprise a nitride formed by a CVD process, and the mold layer 290 may comprise an oxide formed by a CVD process. In an example embodiment, the mold layer 290 may be formed to a thickness of about 10,000 to about 20,000 Å.

The mold layer 290 and the etch stop layer 285 may be partially removed to form a preliminary hole 293 therethrough exposing the second plug 270. The mold layer 290 may be removed by a dry etching process using the etch stop layer 285 as an end point thereof, and further the etch stop layer 285 may be removed. The preliminary hole 293 may not have a vertical profile with respect to the substrate 200.

Figure 12:
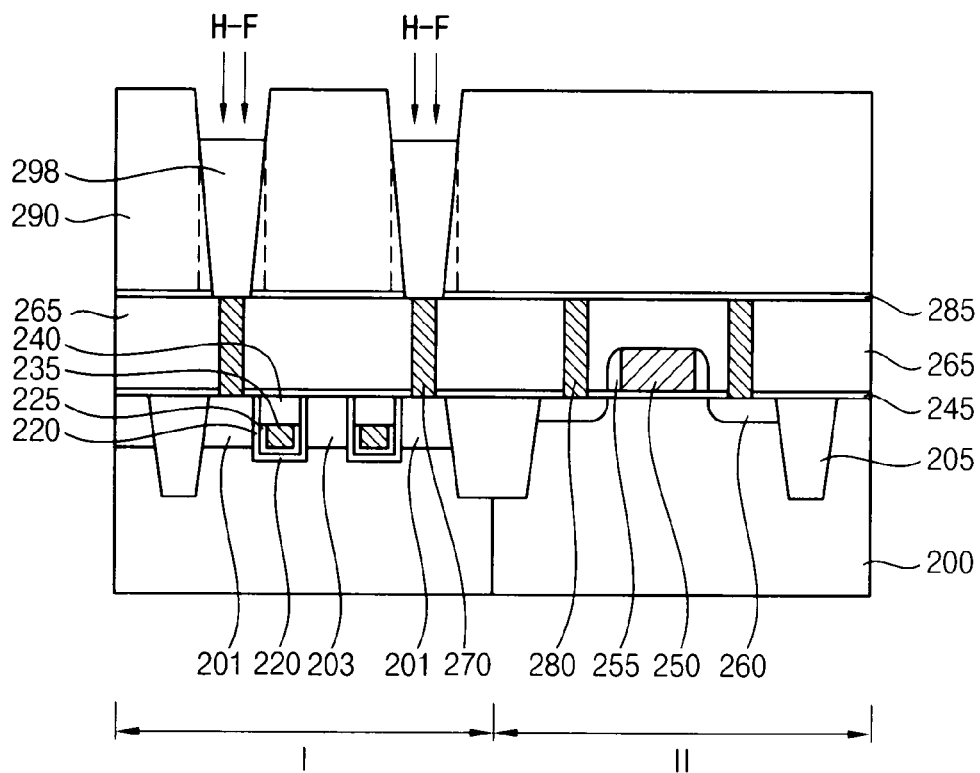

Referring to FIG. 12, processes that are substantially the same as those that were discussed, above, with reference to FIG. 1 may be performed. For example, a photosensitive layer pattern 298 including organic polymer may be formed on the second plug 270 and the first insulating interlayer 265 to partially fill the preliminary hole 293, and an etching gas including hydrogen fluoride (HF) or fluorine ($F_2$) may be provided onto the photosensitive layer pattern 298. Thus, a reaction between the etching gas and the photosensitive layer pattern 298 may occur and water may be generated as a by-product. The hydrogen fluoride (HF) or fluorine ($F_2$) in the etching gas may be dissolved in the water and a portion of the mold layer 290 adjacent to a lower (proximate) portion of the photosensitive layer pattern 298 may be wet etched.

Figure 13:
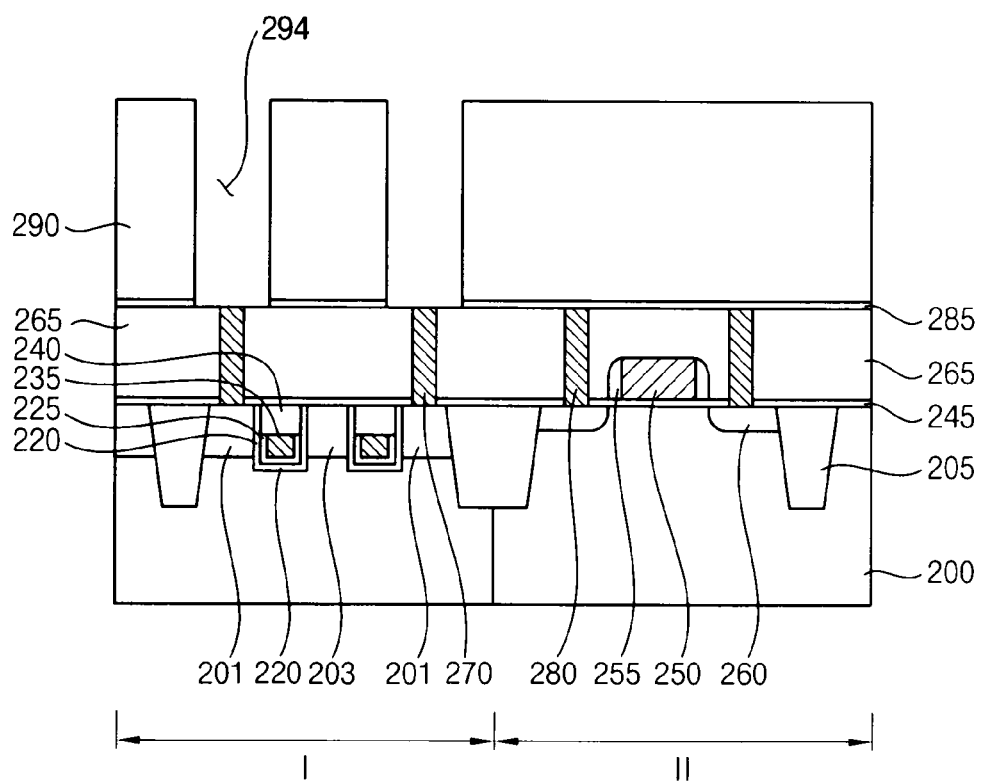
Figure 14:
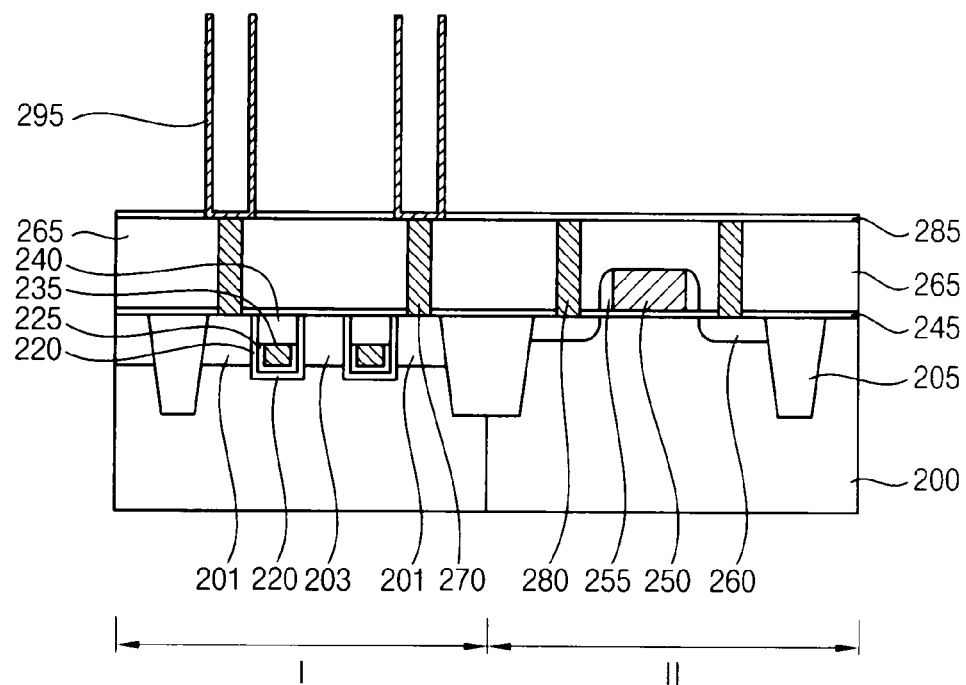

Referring to FIG. 13, the photosensitive layer pattern 298 in the preliminary hole 293 may be removed to form a hole 294, shown in FIG. 14, having a vertical profile.

A lower electrode layer (not shown) may be formed on a bottom and a sidewall of the hole 294 and on the mold layer 290, shown in FIG. 13. The lower electrode layer may be formed of titanium, tungsten, tantalum, titanium nitride, tungsten nitride, tantalum nitride, titanium silicon nitride, tungsten silicon nitride, etc.

A sacrificial layer (not shown) may be formed on the lower electrode layer. In an example embodiment, the sacrificial layer may be formed of a material having good gap-filling characteristics, such as tonen silazene (TOSZ).

Upper portions of the sacrificial layer and the lower electrode layer may be planarized, e.g., by a chemical mechanical polishing (CMP) process, until a top surface of the mold layer 290 is exposed, so that a lower electrode 295, shown in FIG. 14, may be formed.

To produce the structure shown in FIG. 14, the mold layer 290 and the sacrificial layer may be removed, e.g., by a lift-off process.

Figure 15:
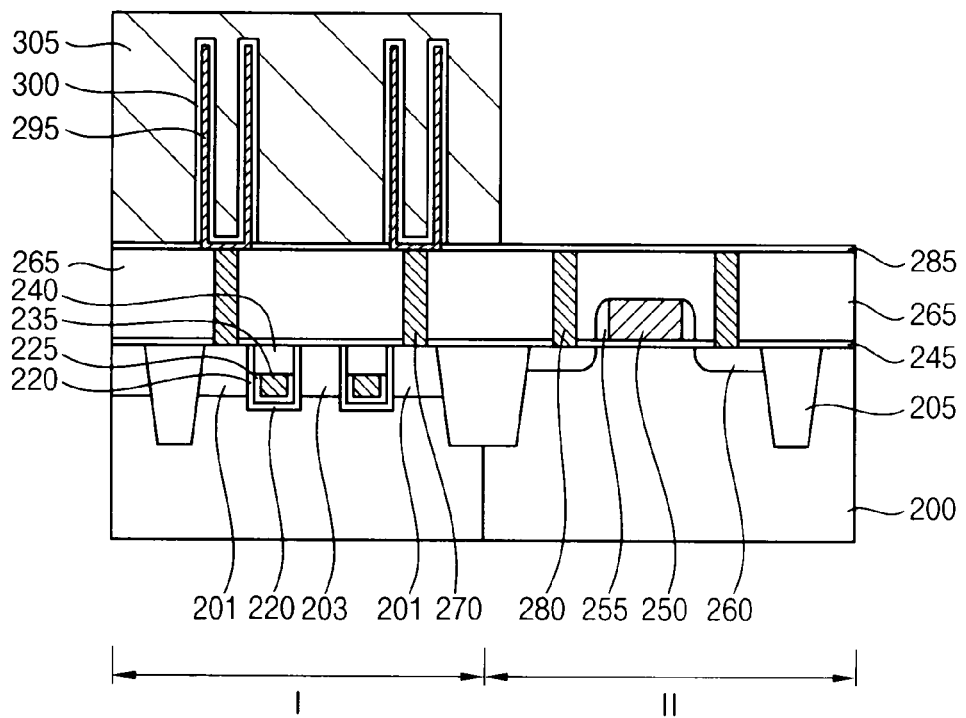

Referring to FIG. 15, a dielectric layer 300 and an upper electrode 305 may be sequentially formed on the lower electrode 295 and a portion of the etch stop layer 285 in the first region I.

The dielectric layer 300 may be formed of silicon oxide or a high-k dielectric material, such as zirconium oxide, zirconium oxynitride, aluminum oxide, tantalum oxide, titanium oxide, etc. The upper electrode 305 may be formed of titanium, tungsten, tantalum, titanium nitride, tungsten nitride, tantalum nitride, titanium silicon nitride, tungsten silicon nitride, etc.

Figure 16:
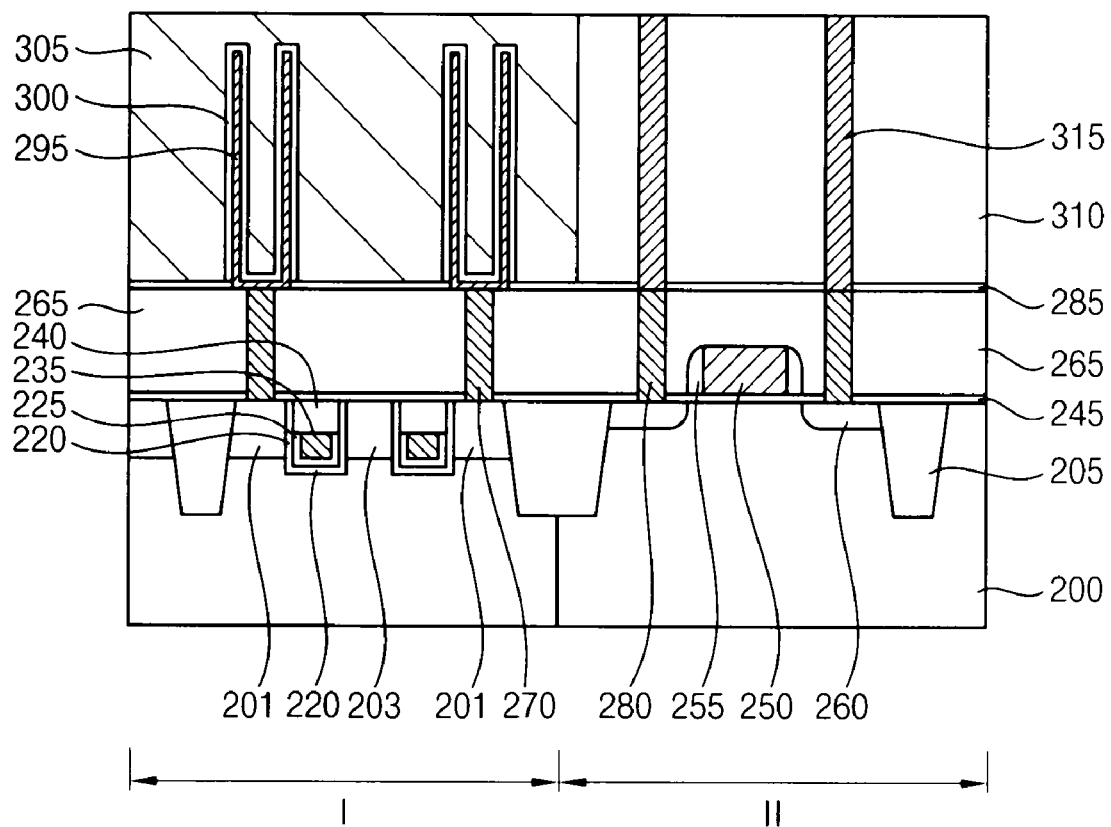

Referring to FIG. 16, a second insulating interlayer 310 may be formed on a portion of the etch stop layer 285 in the second region II.

The second insulating interlayer 310 may remove the step difference between the first and second regions I and II. The second insulating interlayer 310 may be formed, e.g., using tetra ethyl ortho silicate (TEOS), high density plasma (HDP) oxide and planarized, e.g., by a self-stopping chemical mechanical polishing (CMP) process.

Fourth plug 315 may be formed through the second insulating interlayer 310 to be electrically connected to the third plug 280. A wiring (not shown) may be further formed on the second insulating interlayer 310 to be electrically connected to the fourth plug 315. A protection layer (not shown) may be further formed on the second insulating interlayer 310 to cover the wiring, so that the semiconductor device may be manufactured.

FIGS. 17 to 30 are cross-sectional views illustrating a method of manufacturing a semiconductor device using the method of forming the trench or the hole in accordance with example embodiments.

Figure 17:
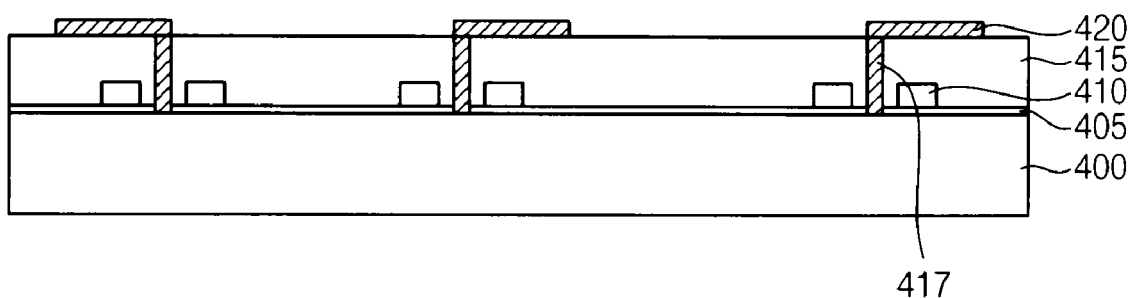

The substrate 400 of FIG. 17 may be divided into a cell region and a peripheral circuit region. In example embodiments, the substrate 400 may include single-crystal silicon. An isolation layer (not shown) may be formed on the substrate 400 to define an active region and a field region.

A gate insulation layer 405 may be formed on the substrate 400, and gate electrodes 410 may be formed on the gate insulation layer 405. Impurities may be implanted into the substrate 400 using the gate electrodes 410 as an ion implantation mask to form source/drain regions (not shown) at upper portions of the substrate 400 adjacent to the gate electrodes 410. Thus, transistors including the gate electrodes 410 and the source/drain regions may be formed.

A first lower insulating interlayer 415 may be formed on the substrate 400 to cover the transistors. The first lower insulating interlayer 415 may comprise silicon oxide formed by a CVD process.

A first plug 417 may be formed through the first lower insulating interlayer 415 and the gate insulation layer 405. A first wiring 420 may be formed on the first lower insulating interlayer 415 to be electrically connected to the first plug 417. The first wiring 420 may be formed of a metal or doped polysilicon.

Figure 18:
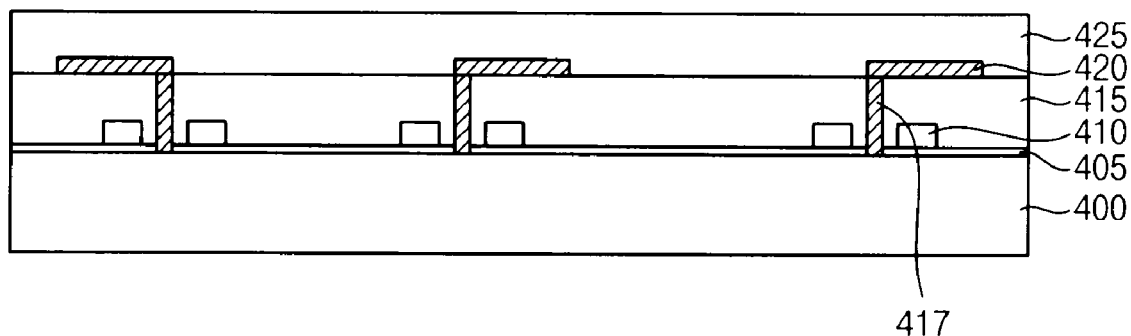

Referring to FIG. 18, a second lower insulating interlayer 425 may be formed on the first lower insulating interlayer 415 to cover the first wiring 420.

Figure 19:
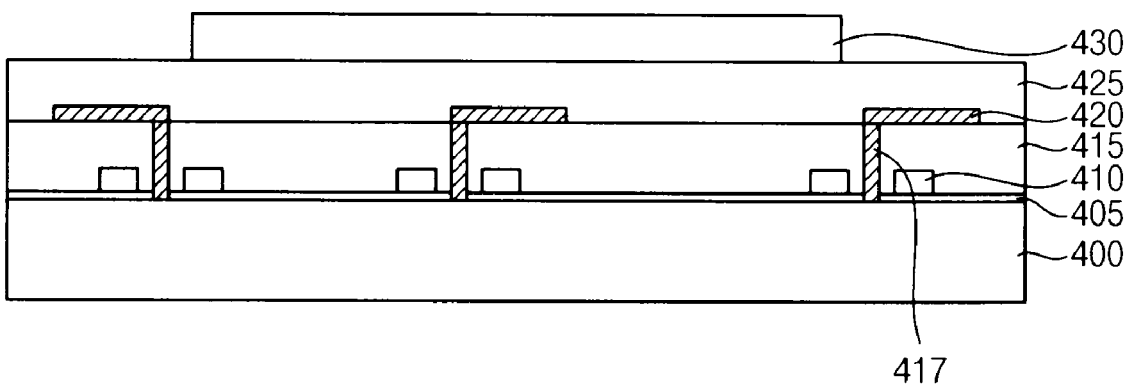

Referring to FIG. 19, a single-crystal silicon layer 430 may be formed on the second lower insulating interlayer 425. The single-crystal silicon layer 430 may be formed by a bonding method.

Particularly, a donor substrate including single-crystal silicon may be provided. Hydrogen ions may be implanted into a portion of the donor substrate to form an ion implantation region. The donor substrate may be attached to the second lower insulating interlayer 425 at a high temperature. A heat treatment may be performed on the donor substrate to divide the donor substrate into two parts at the ion implantation region. A part of the donor substrate attached to the second lower insulating interlayer 425 may be planarized by a CMP process to form the single-crystal silicon layer 430. In example embodiments, the single-crystal silicon layer 430 may include impurities.

The single-crystal silicon layer 430 may be patterned, thereby remaining only in the cell region.

Figure 20:
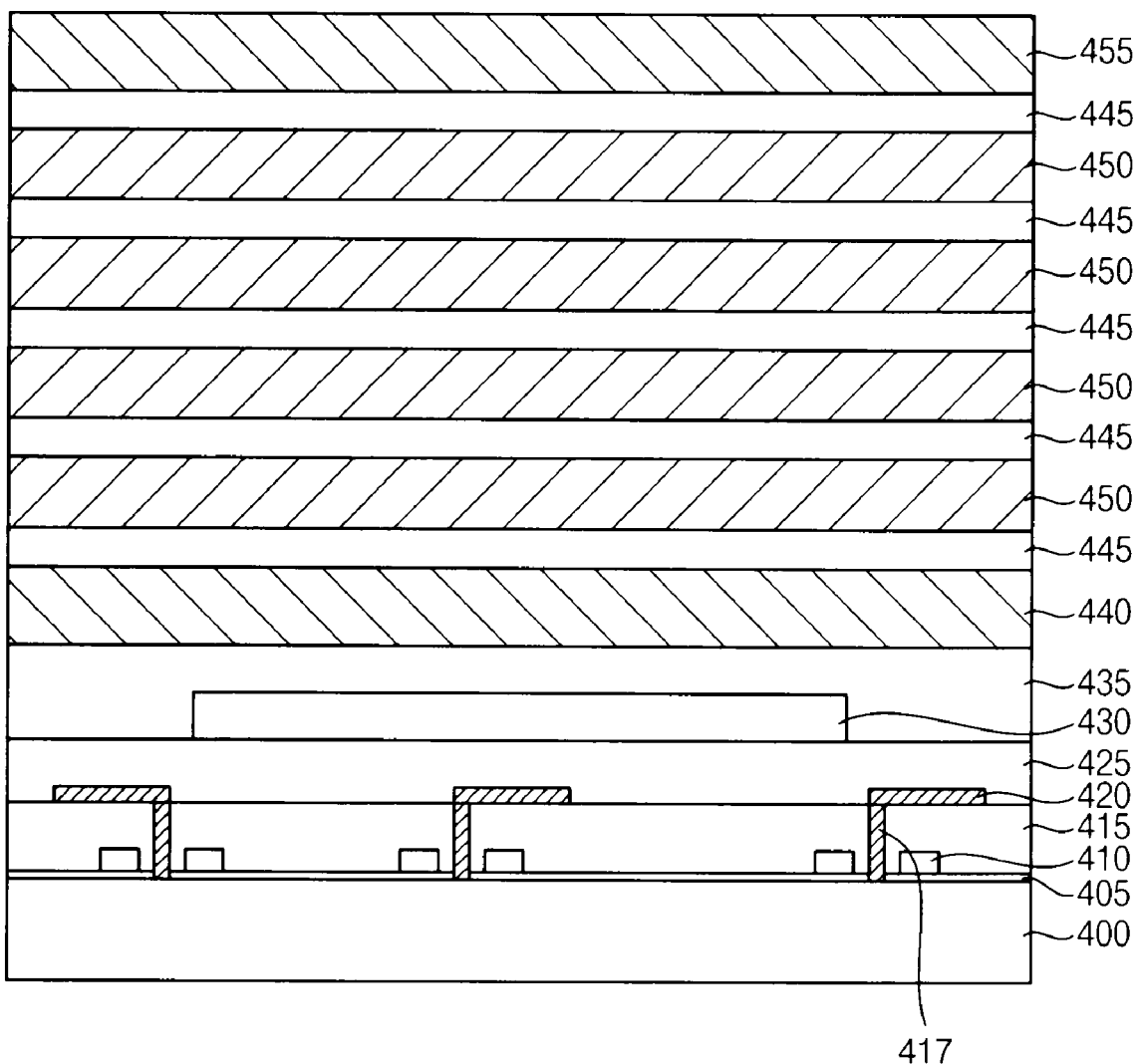

Referring to FIG. 20, a third lower insulating interlayer 435 may be formed on the second lower insulating interlayer 425 to cover the single-crystal silicon layer 430. In an example embodiment, the third insulating interlayer 435 may be formed to a thickness of about 500 to about 1,500 Å.

A ground selection line (GSL) layer 440 may be formed on the third lower insulating interlayer 435. The GSL layer 440 may be formed of doped polysilicon or a metal.

A plurality of intermetal dielectric layers 445 and a plurality of sacrificial layers 450 may be alternately and sequentially formed on the GSL layer 440. The intermetal dielectric layers 445 may be formed of an oxide, and the sacrificial layers 450 may be formed of a nitride. In an example embodiment, each of the intermetal dielectric layers 445 may be formed to a thickness of about 500 to about 1,000 Å, and each of the sacrificial layers 450 may be formed to a thickness of about 500 to about 1,500 Å.

A string selection line (SSL) layer 455 may be formed on an uppermost intermetal dielectric layer 440. The SSL layer 455 may be formed of doped polysilicon or a metal.

An upper insulating interlayer (not shown) may be further formed on the SSL layer 455 using an oxide.

Figure 21:
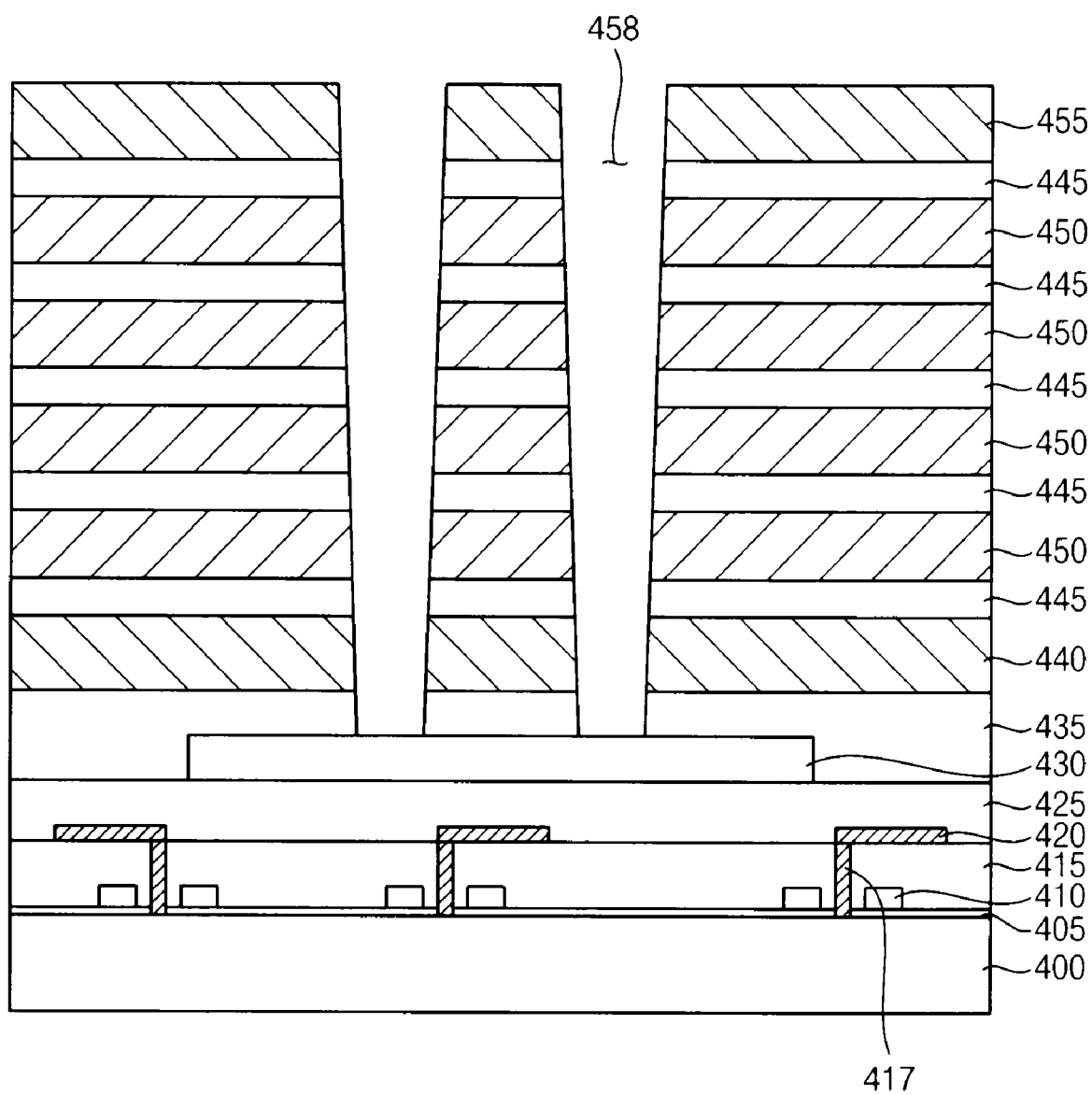

Referring to FIG. 21, a first preliminary hole 458 may be formed through the SSL layer 455, the intermetal dielectric layers 445, the sacrificial layers 450, the GSL layer 440 and the third lower insulating interlayer 435 to expose the single-crystal silicon layer 430.

Figure 22:
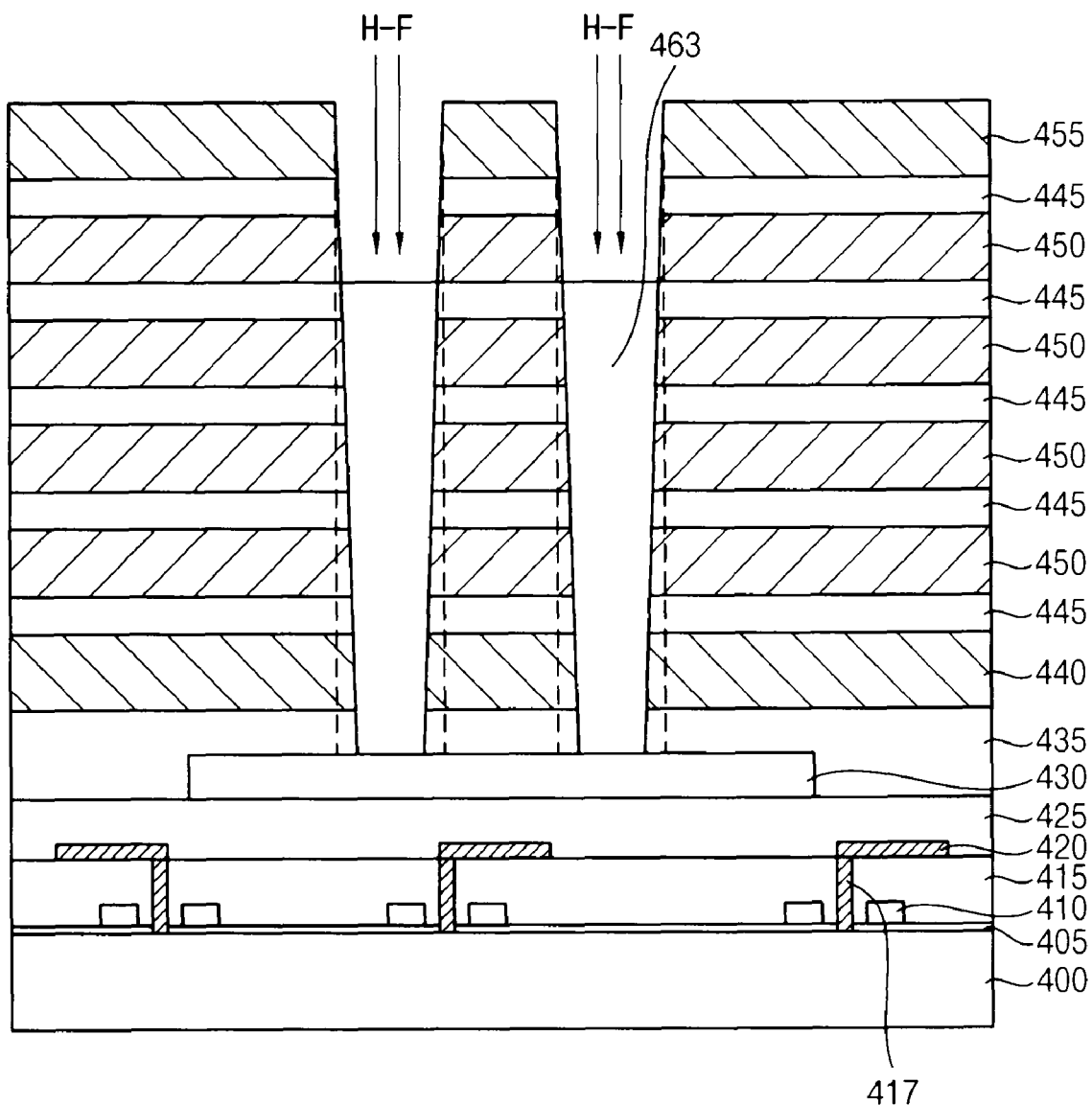

Referring to FIG. 22, processes that are substantially the same as those that were discussed, above, with reference to FIG. 1 may be performed. For example, a photosensitive layer pattern 463 including organic polymer may be formed on the single-crystal silicon layer 430 to partially fill the first preliminary hole 458 (shown in FIG. 21), and an etching gas including hydrogen fluoride (HF) or fluorine ($F_2$) may be provided onto the photosensitive layer pattern 463. Thus, a reaction between the etching gas and the photosensitive layer pattern 463 may occur and water may be generated as a by-product. The hydrogen fluoride (HF) or fluorine ($F_2$) in the etching gas may be dissolved in the water and portions of the intermetal dielectric layers 445, the sacrificial layers 450, the GSL layer 440 and the third lower insulating interlayer 435 adjacent to a lower potion of the photosensitive layer pattern 463 may be wet etched.

Figure 23:
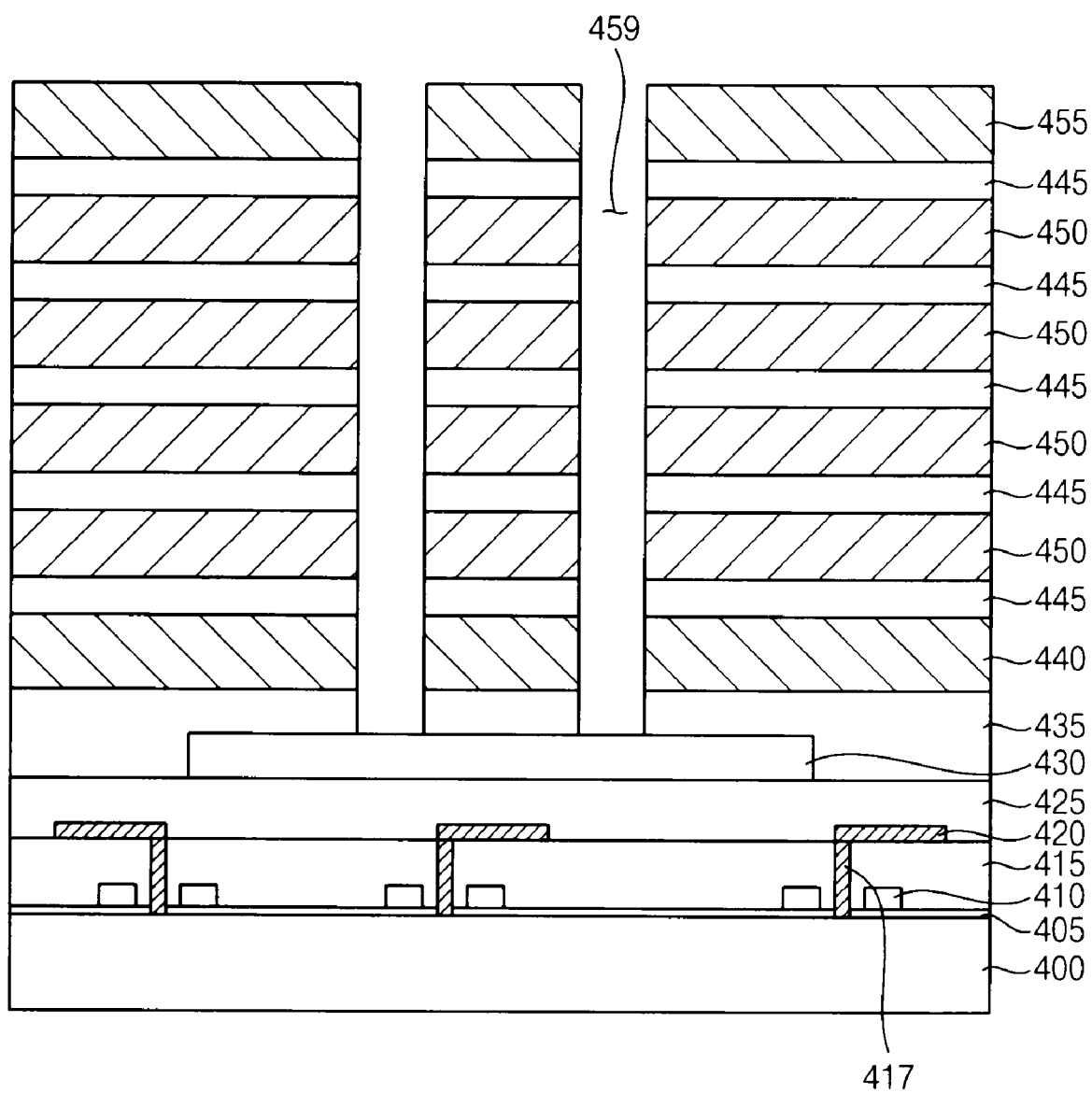

The photosensitive layer pattern 463 (shown in FIG. 22) in the preliminary hole 458 (shown in FIG. 21) may be removed to form a hole 459 having a vertical profile, as shown in FIG. 23.

Figure 24:
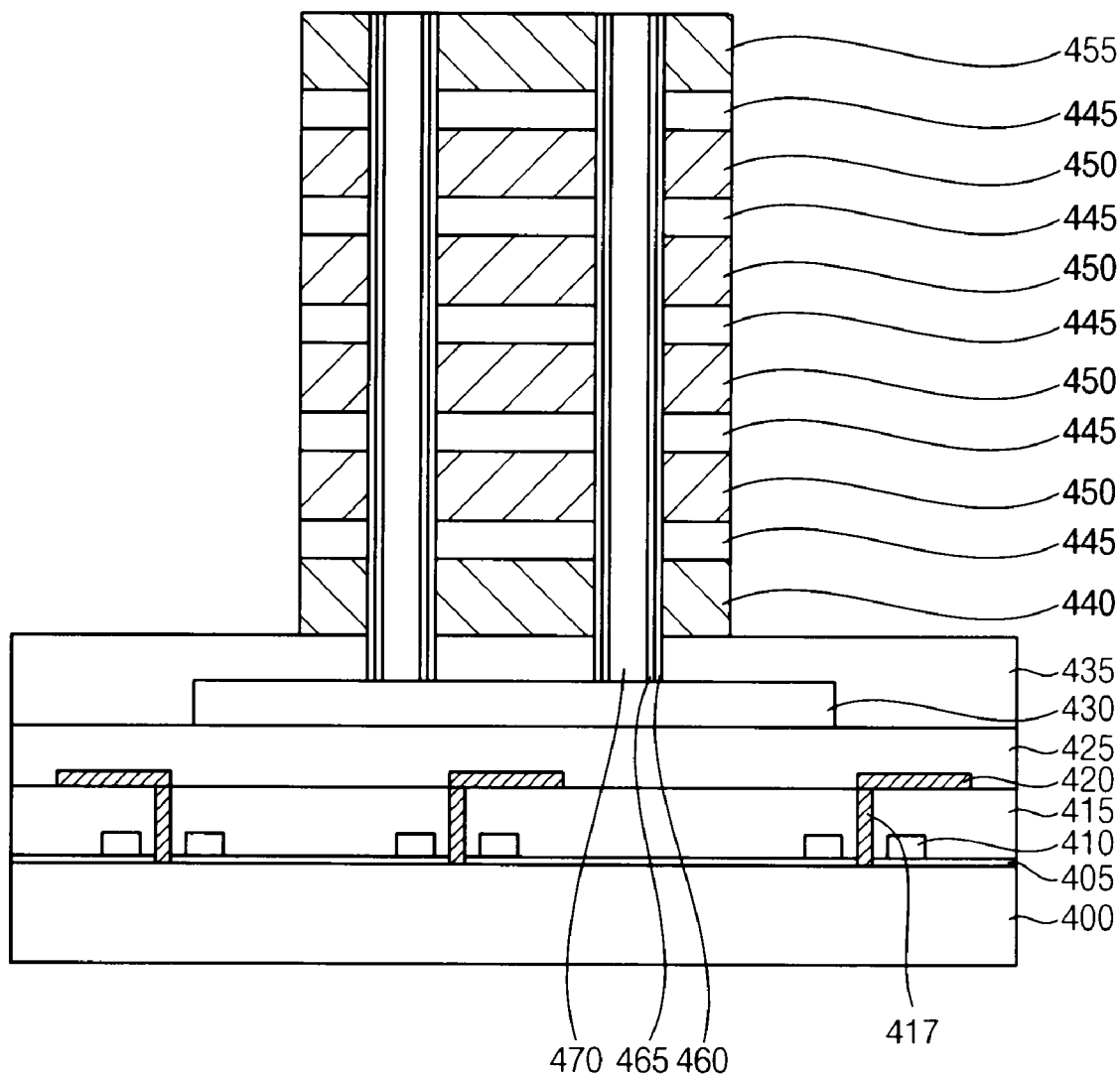

Referring to FIG. 24, a tunnel insulation layer 460 and a channel 465 may be sequentially formed on a sidewall of the first hole 459.

The tunnel insulation layer 460 may be formed of silicon oxide. In an example embodiment, the tunnel insulation layer 460 may be formed to have a thickness of about 30 to about 100 Å. The channel 465 may comprise polysilicon formed by a CVD process or an ALD process. In an example embodiment, after forming a polysilicon layer, a laser treatment may be further performed on the polysilicon layer to form a single-crystal silicon layer.

An insulation layer 470 may be formed to fill a remaining portion of the first hole 459.

Meanwhile, the SSL layer 455, the intermetal dielectric layers 445, the sacrificial layers 450, and the GSL layer 440 may be patterned to expose a portion of the third lower insulating interlayer 435 in the peripheral circuit region.

Figure 25:
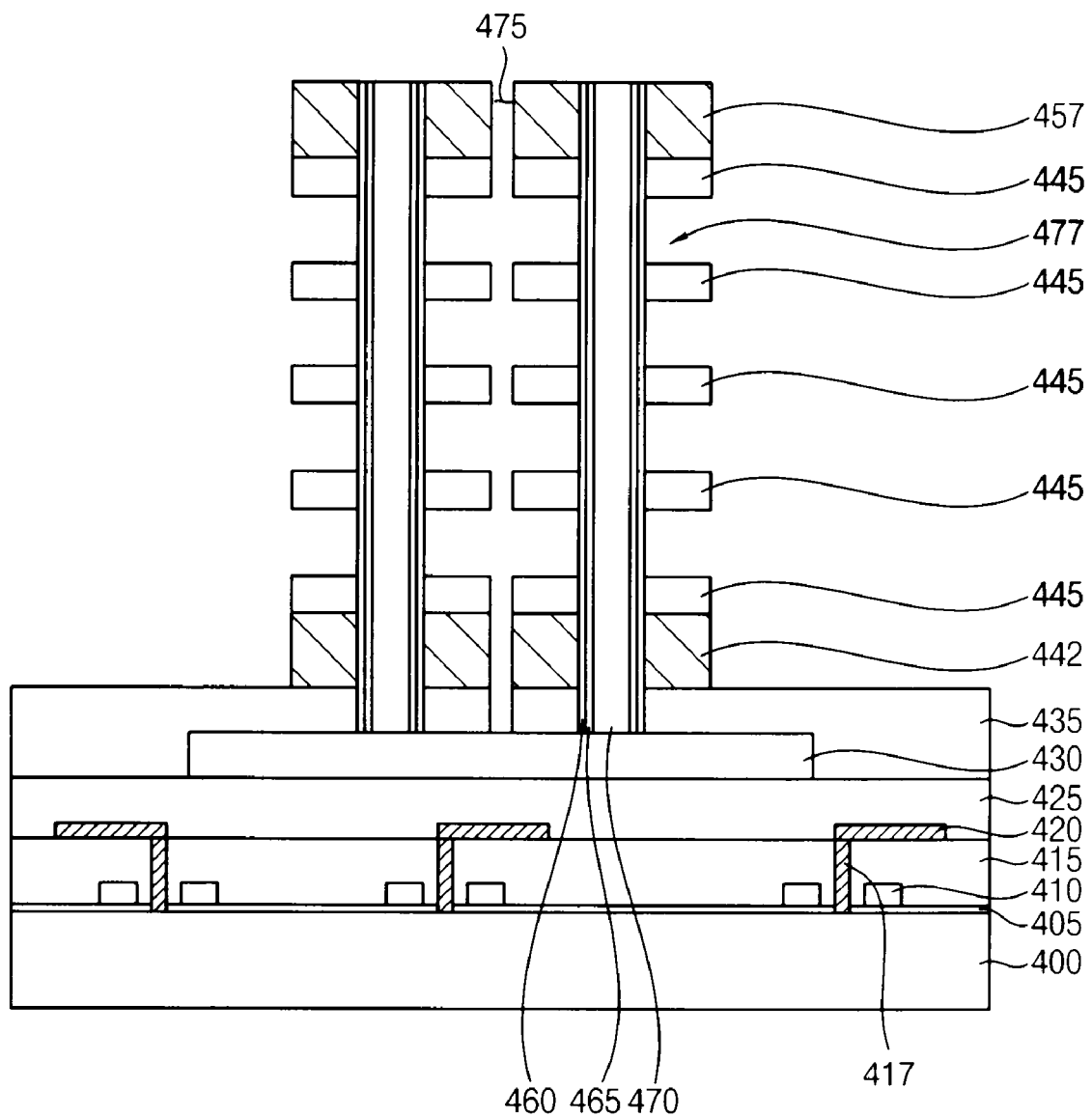

The SSL layer 455, the intermetal dielectric layers 445, the sacrificial layers 450, the GSL layer 440 and the third lower insulating interlayer 435, all shown in FIG. 24, may be partially removed to form a second hole 475 exposing the single-crystal silicon layer 430, as shown in FIG. 25. Thus, the SSL layer 455 and the GSL layer 440 of FIG. 24 may be converted into a SSL 457 and a GSL 442, respectively, as shown in FIG. 25. An etching solution may be provided into the second hole 475 to remove the sacrificial layers 450, thereby forming recesses 477, as shown in FIG. 25. The etching solution may include phosphoric acid.

Figure 26:
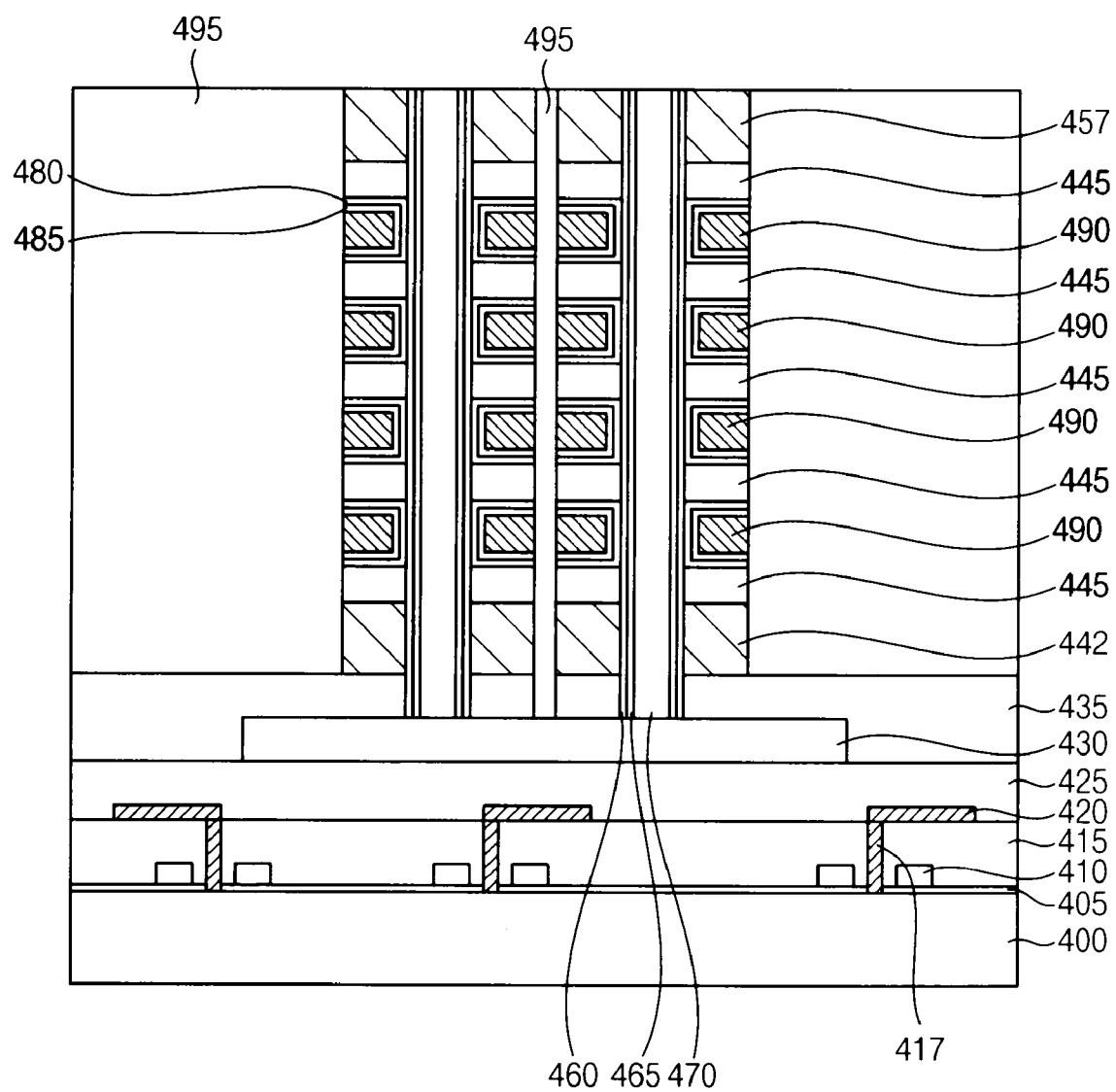

Referring to FIG. 26, a charge trapping layer 480, a blocking layer 485 and a control gate 490 may be sequentially formed on inner walls of the recesses 477 and the tunnel insulation layer 460 to fill the recesses 477 of FIG. 25. The control gate 490 may serve as a word line.

The charge trapping layer 480 may be formed of silicon nitride or a metal oxide; the blocking layer 485 may be formed of silicon oxide or a metal oxide; and the control gate 490 may be formed of a metal.

An isolation layer 495 may be formed on the single-crystal silicon layer 430 to fill the second hole 475, shown in FIG. 25, and cover the portion of the third lower insulating interlayer 435 in the peripheral circuit region.

Figure 27:
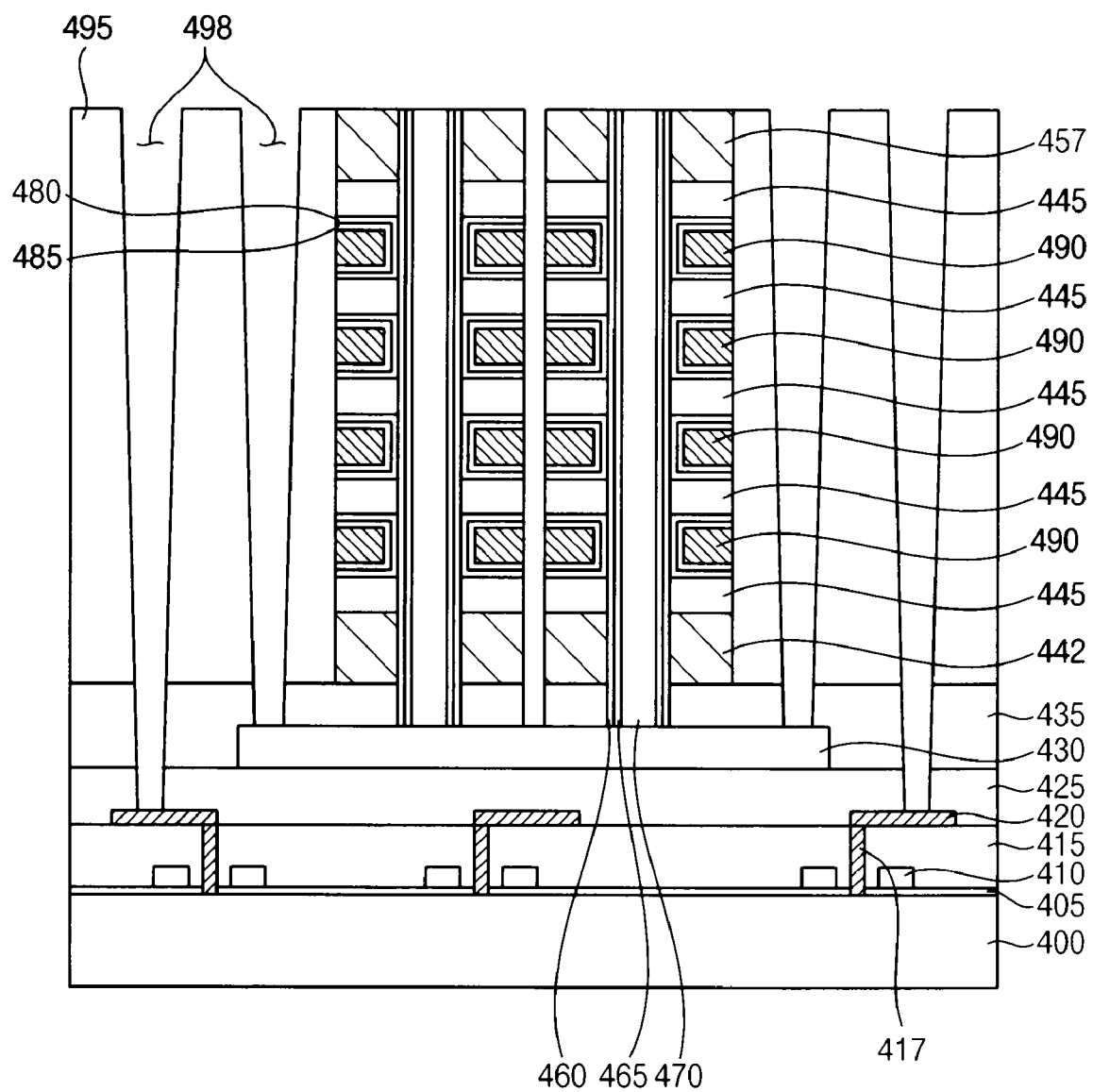

The isolation layer 495 in the peripheral circuit region may be partially removed to form third preliminary holes 498 exposing the first wiring 420 and the single-crystal silicon layer 430, as shown in FIG. 27.

Figure 28:
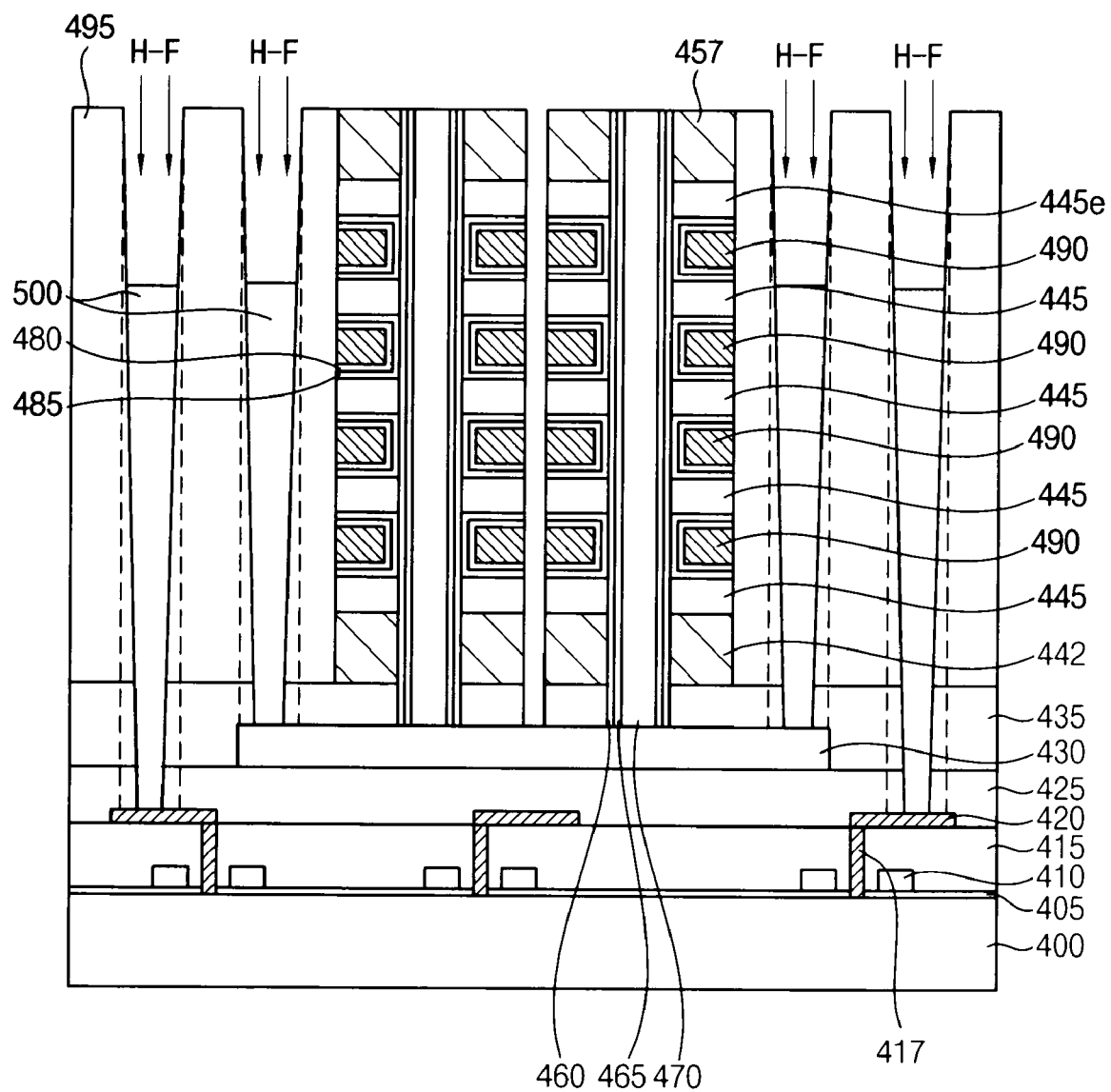

Referring to FIG. 28, processes that are substantially the same as those described, above, with reference to FIG. 1 may be performed. For example, a photosensitive layer pattern 500, including organic polymer, may be formed on the first wiring 420 and on the single-crystal silicon layer 430 to partially fill the third preliminary holes 498; and an etching gas, including hydrogen fluoride (HF) or fluorine ($F_2$), may be provided onto the photosensitive layer pattern 500. Thus, a reaction between the etching gas and the photosensitive layer pattern 500 may occur and water may be generated as a by-product. The hydrogen fluoride (HF) or fluorine ($F_2$) in the etching gas may be dissolved in the water, and a portion of the isolation layer 495 and the second and third lower insulating interlayers 425 and 435 adjacent to a lower (proximate) portion of the photosensitive layer pattern 500 may be wet etched.

Figure 29:
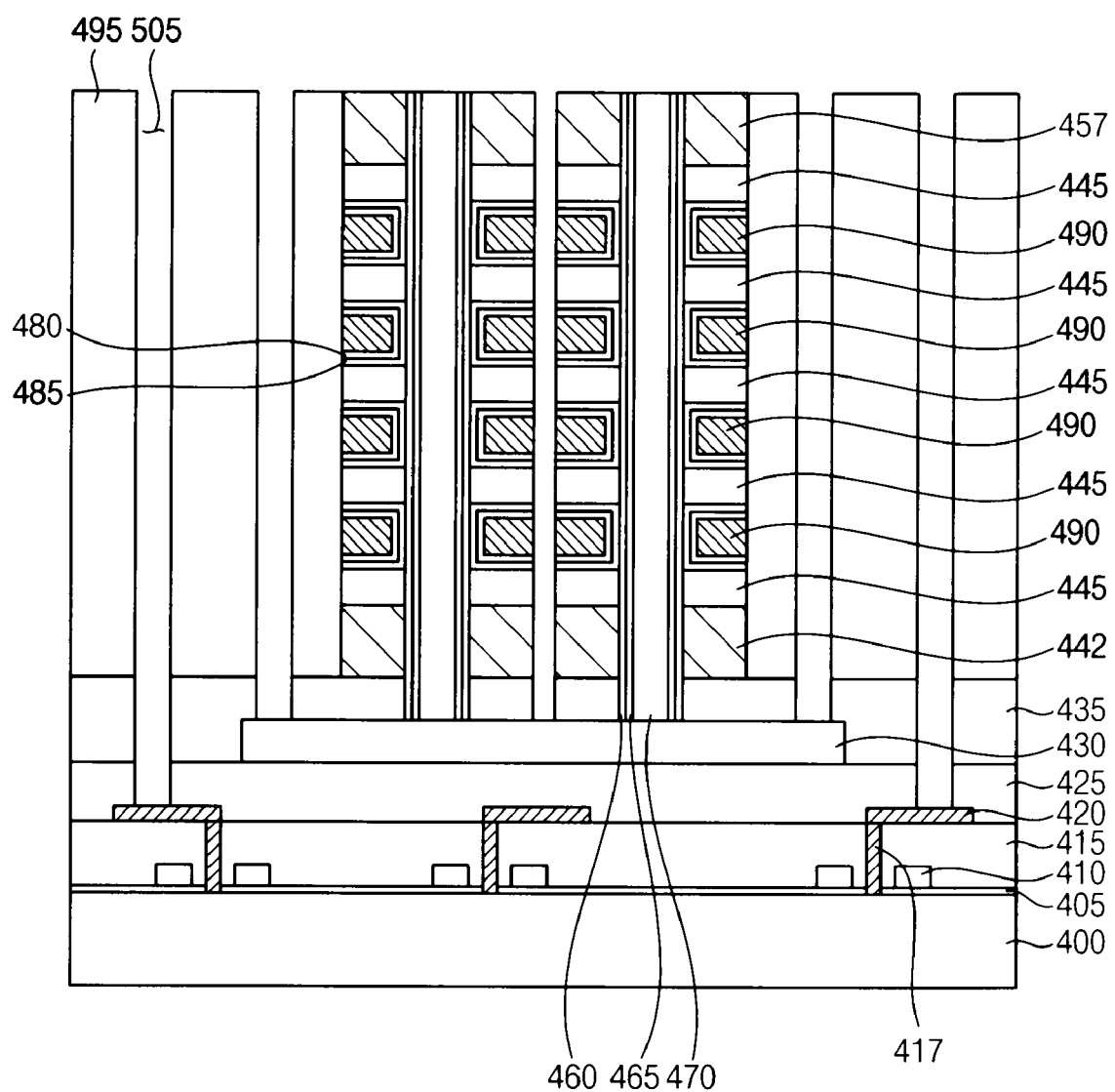

The photosensitive layer pattern 500 in the third preliminary holes 498 (see FIGS. 27 and 28) may be removed to form third holes 505 having a vertical profile, as shown in FIG. 29.

Figure 30:
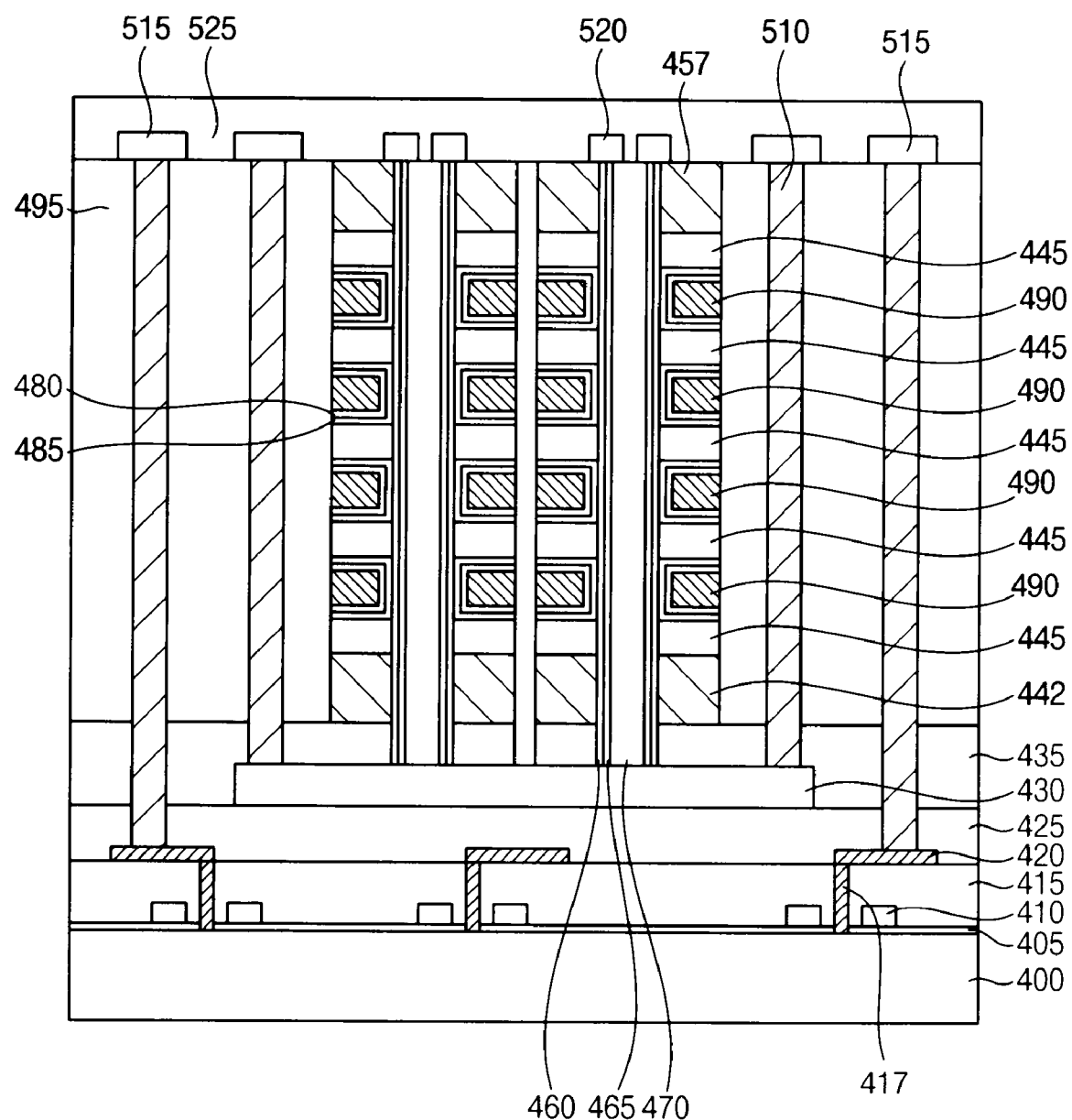

Referring to FIG. 30, second plugs 510 filling the third holes 505, as shown in FIG. 29, may be formed; and second wirings 515 may be formed on the isolation layer 495 to be electrically connected to the second plugs 510.

A bit line 520 electrically connected to the channel 465 may be formed, and a protection layer 525 covering the bit line 520 may be formed on the isolation layer 495.

Thus, the semiconductor device may be manufactured.

The foregoing is illustrative of example embodiments and is to not be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is to not be construed as limited to the specific example embodiments disclosed, and that modifications to the disclosed example embodiments, as well as other example embodiments, are intended to be included within the scope of the appended claims.

What is claimed is:

1. A method of forming a hole, comprising:
   forming an insulation layer on a substrate;
   forming a preliminary hole through the insulation layer, the preliminary hole exposing the substrate;
   forming a photosensitive layer pattern on the substrate to fill the preliminary hole, the photosensitive layer pattern including an organic polymer; and
   providing an etching gas onto the photosensitive layer pattern to etch the insulation layer such that a width of the preliminary hole is increased, the etching gas including hydrogen fluoride (HF) or fluorine ($F_2$).

2. The method of claim 1, wherein the insulation layer includes silicon oxide.

3. The method of claim 1, wherein the organic polymer includes hydroxyl group (—OH), amino group (—NH$_2$) or thiol group (—SH).

4. The method of claim 1, wherein the etching gas includes deionized water (DIW) vapor.

5. The method of claim 1, wherein the photosensitive layer pattern includes a portion proximate the substrate and a portion remote from the substrate, and wherein providing the etching gas onto the photosensitive layer pattern to etch the insulation layer includes etching a portion of the insulation layer adjacent to the portion of the photosensitive layer pattern proximate the substrate.

6. The method of claim 1, wherein providing the etching gas onto the photosensitive layer pattern to etch the insulation layer includes forming water by reacting the etching gas with the photosensitive layer pattern.

7. The method of claim 6, wherein the photosensitive layer pattern includes a remote portion that is remote from the substrate and a proximate portion that is proximate the substrate, wherein water generated by the reaction of the etching gas and the remote portion of the photosensitive layer pattern is vaporized, and water generated by the reaction of the etching gas and the proximate portion of the photosensitive layer pattern is not vaporized.

8. The method of claim 1, wherein providing the etching gas onto the photosensitive layer pattern is performed at a temperature of about 120 to about 180° C.

9. The method of claim 1, wherein the photosensitive layer pattern fills a portion of the preliminary hole proximate the substrate.

10. The method of claim 1, wherein the substrate includes an etch stop layer on which the insulation layer is formed, and wherein the preliminary hole exposes the etch stop layer.

11. A method of forming a hole, comprising:
    forming an insulation layer on a substrate;
    removing an upper portion of the insulation layer to form a preliminary trench in the insulation layer;
    forming a photosensitive layer pattern filling the preliminary trench, the photosensitive layer pattern including an organic polymer; and
    providing an etching gas onto the photosensitive layer pattern to etch the insulation layer such that a width of the preliminary trench is increased, the etching gas including hydrogen fluoride (HF) or fluorine (F$_2$).

12. The method of claim 11, wherein the insulation layer includes silicon oxide.

13. The method of claim 11, wherein the organic polymer includes hydroxyl group (—OH), amino group (—NH$_2$) or thiol group (—SH).

14. The method of claim 11, wherein the etching gas includes deionized water (DIW) vapor.

15. The method of claim 11, wherein providing the etching gas onto the photosensitive layer pattern to etch the insulation layer includes etching a portion of the insulation layer adjacent to a portion of the photosensitive layer pattern that is proximate the substrate.

16. The method of claim 11, wherein providing the etching gas onto the photosensitive layer pattern to etch the insulation layer includes forming water by reacting the etching gas with the photosensitive layer pattern.

17. The method of claim 16, wherein the photosensitive layer pattern includes an remote portion that is remote from the substrate and a proximate portion that is proximate the substrate, and wherein water generated by the reaction of the etching gas and the remote portion of the photosensitive layer pattern is vaporized, and water generated by the reaction of the etching gas and the proximate portion of the photosensitive layer pattern is not vaporized.

18. A method of forming a hole, comprising:
    forming an insulation layer on a substrate;
    forming a preliminary hole through the insulation layer, the preliminary hole exposing the substrate;
    forming a porous layer pattern on the substrate to fill the preliminary hole, the porous layer pattern including an organic polymer; and
    providing an etching gas onto the porous layer pattern to etch the insulation layer so that a width of the preliminary hole is increased, the etching gas including hydrogen fluoride (HF) or fluorine (F$_2$).

19. The method of claim 18, wherein the insulation layer includes silicon oxide, and the porous layer pattern includes silicon-on-glass (SOG).

20. The method of claim 18, wherein providing the etching gas onto the porous layer pattern to etch the insulation layer includes etching a portion of the insulation layer adjacent to a portion of the porous layer pattern that is proximate the substrate.

* * * * *